(12) United States Patent
Kwak

(10) Patent No.: US 6,590,814 B1
(45) Date of Patent: *Jul. 8, 2003

(54) SEMICONDUCTOR MEMORY DEVICE AND REDUNDANCY METHOD THEREOF

(75) Inventor: Jin Seok Kwak, Suwon (KR)

(73) Assignee: Samsung Electronics Co., LTD, Kyungki-do (KR)

( * ) Notice: Subject to any disclaimer, the term of this patent is extended or adjusted under 35 U.S.C. 154(b) by 10 days.

This patent is subject to a terminal disclaimer.

(21) Appl. No.: 09/717,889

(22) Filed: Nov. 20, 2000

(30) Foreign Application Priority Data

Nov. 20, 1999 (KR) .............................. 99-51737

(51) Int. Cl.⁷ .............................. G11C 7/00; G11C 29/00
(52) U.S. Cl. .................. 365/200; 365/222; 365/230.03; 365/230.06; 365/230.08; 365/189.11
(58) Field of Search ................................ 365/200, 222, 365/230.03, 230.06, 230.08, 189.11

(56) References Cited

U.S. PATENT DOCUMENTS

| | | | | |
|---|---|---|---|---|
| 5,134,583 A | * | 7/1992 | Matsuo et al. | 365/189.05 |
| 5,287,310 A | * | 2/1994 | Schreck et al. | 365/185.02 |
| 5,796,662 A | | 8/1998 | Kalter et al. | 365/200 |
| 5,892,719 A | | 4/1999 | Kanagawa | 365/200 |
| 6,041,006 A | * | 3/2000 | Tsuchiya | 365/210 |
| 6,320,801 B1 | * | 11/2001 | Kwak | 365/189.05 |

* cited by examiner

Primary Examiner—Michael S. Lebentritt
Assistant Examiner—Van Thu Nguyen
(74) Attorney, Agent, or Firm—Harness, Dickey & Pierce, PLC

(57) ABSTRACT

In a semiconductor memory device that includes memory cell array banks, memory cell array blocks in each memory cell array bank, partial blocks in each memory cell array block, data input/output line pairs connected to the partial blocks, and a predetermined number of redundant partial blocks connected to a predetermined number of redundant data input/output line pairs, the semiconductor memory device further includes an address setting circuit to set a redundant control signal and a defect address of each of the memory cell array blocks, decoder and shifting control signal generating circuits to generate shifting control signals to control shifting of the data input/output line pairs and the predetermined number of redundant data input/output line pairs by decoding the redundant control signal and the defective address, and switching circuits for routing data through data input/output line pairs adjacent to a corresponding data input/output line pairs in response to each of the shifting control signals. Therefore, the semiconductor memory device can generate the shifting control signals dynamically to column cycle and can construct a redundancy circuit with a small number of fuses.

42 Claims, 12 Drawing Sheets

SEMICONDUCTOR MEMORY DEVICE AND REDUNDANCY METHOD THEREOF

BACKGROUND OF THE INVENTION

1. Field of the Invention

The present invention relates to a semiconductor memory device, and more particularly, a semiconductor memory device using a redundancy method that can substitute a data input/output line pair with an adjacent data input/output line pair.

2. Description of the Prior Art

A semiconductor memory device of merged memory logic (MML) typically has a large number of data input/output pins for high-speed input/output of a large quantity of data. The semiconductor memory device conventionally has a signal line arrangement in which word lines are perpendicular to bit lines, column select signal lines are parallel to the word lines, and data input/output lines are parallel to the bit lines. Such semiconductor memory devices further include redundancy circuitry capable of substituting a redundant data input/output line for a data input/output line connected to a defective memory cell. U.S. Pat. No. 5,892,719, for example, describes a redundancy method that substitutes a redundant data input/output line for a data input/output line connected to a defective memory cell. A redundancy method disclosed in U.S. Pat. No. 5,796,662 replaces a data input/output line connected to a defective memory cell with an adjacent redundant data input/output line.

FIG. 1 is a block diagram of a redundancy circuit of a semiconductor memory device disclosed in U.S. Pat. No. 5,796,662. The memory device includes n memory cell array blocks 10-1 to 10-n, n fuse circuits 12-1 to 12-n, buffers 14-1 and 14-2, and shift circuits 16-1 and 16-2.

Output signals of n fuse circuits 12-1 to 12-n program redundancy decoders and shift select signals of each of n memory cell array blocks 10-1 to 10-n. If a memory cell array block 10-(n/2+1) is selected, a fuse circuit 12-(n/2+1) transmits bit shift select signals to a buffer 14-2. The buffer 14-2 transmits shifting control signals to a shift circuit 16-2, and the shift circuit 16-2 shifts a data input/output line pair in response to the shifting control signals.

A redundancy circuit of a semiconductor memory device shown in FIG. 1 includes fuse circuits that are programmable to indicate whether addresses of respective memory cell array blocks are defective addresses. The redundancy method of the semiconductor memory device of FIG. 1 can handle multiple defective memory cell array blocks in one bank. But, for a memory cell array bank constructed in multiple banks, it is difficult to dynamically generate a shifting control signal according to a column cycle. That is, the prior redundancy method has difficulty in generating the shifting control signal dynamically to the column cycle in the active state of multiple banks when different blocks of different banks have different defective addresses.

That is, it is possible to generate the shifting control signal dynamically to column cycle for one bank, but it is difficult to generate different defective addresses of different blocks of different banks dynamically to column cycle in the active state of multiple banks in a multi-bank structure.

To solve the above problem, every data input/output line pair can have a fuse corresponding to each of memory cell array blocks, and the redundancy method cuts the fuses behind a defective data input/output line pair by each block after a pre-laser test. This method needs a large number of fuses by memory cell array blocks. For example, a device having 512 data input/output lines and eight memory cell array blocks requires 4096 fuses to store defective addresses separately by the eight memory cell array blocks and to generate input/output shift information dynamically. Typically, the large number of fuses makes this method impractical. Also, the fuses make it difficult to layout power lines or signal lines.

SUMMARY OF THE INVENTION

Some embodiments of the present invention provide a semiconductor memory device that can generate a shifting control signal dynamically to a column cycle in a multi-bank structure without requiring the large number of fuses used in known memory devices.

Other embodiments of the present invention provide a redundancy method that can generate a shifting control signal dynamically to a column cycle in a multi-bank structure without requiring the large number of fuses used in known memory devices.

One exemplary embodiment of a semiconductor memory device in accordance with the present invention includes an address setting means to set a redundant control signal and a defective address respectively in response to each of a plurality of first control signals, and a plurality of decoders and shifting control circuits for generating the decoding output signals by decoding each redundant control signal and defective address, latching a plurality of decoding output signals in response to each of a plurality of second control signals, and generating the latched data with a plurality of shifting control signals in response to each of the plurality of third control signals.

In one preferred embodiment, the present invention includes a plurality of memory cell array banks, a plurality of memory cell array blocks of each of the plurality of memory cell array banks, and a plurality of partial blocks of each of the memory cell array blocks connected to each of a plurality of data input/output line pairs and a predetermined number of redundant partial blocks of each of the memory cell array blocks connected to each of a predetermined number of redundant data input/output line pairs, includes an address setting means for setting a redundant control signal and defective addresses of each of the memory cell array blocks, a plurality of decoders and shifting control signals generation means for generating a plurality of shifting control signal for controlling shifting of the data input/output line pairs and of a predetermined number of redundant data input/output line pairs by decoding the redundant control signal and the defective address, and a plurality of switching means for outputting data output from a data input/output line pair adjacent to a corresponding data input/output line pairs in response to each of the shifting control signals, and for inputting input data to a data input/output line pair adjacent to the corresponding data input/output line pair.

In another preferred embodiment, the present invention includes a plurality of memory cell array banks, a plurality of memory cell array blocks of each the memory cell array banks, a plurality of partial blocks of each of the memory cell array blocks connected to each of a plurality of data input/output line pairs, a predetermined number of redundant partial blocks of each of the memory cell array blocks connected to each of a predetermined number of redundant data input/output line pairs, a plurality of partial blocks according to a column address group of each of the partial blocks and a predetermined number of redundant partial blocks according to a column address group of each of a predetermined number of redundant partial blocks, a control signal generation means for generating selection control signals by column address groups for selecting a plurality of partial blocks according to the column address group in response to an automatic refresh command, an address setting means for setting redundant control signal by column address groups and defective address in response to the selection control signal by column address groups, a plurality of decoders and shifting control signal generation means for generating a plurality of shifting control signals for controlling shifting of the data input/output line pairs and the redundant data input/output line pairs by decoding the redundant control signal and the defective address, and a plurality of switching means for outputting data output from a data input/output line pair adjacent to a corresponding data input/output line pair in response to each of the shifting control signals and for inputting input data to a data input/output line pair adjacent to the corresponding data input/output line pair.

In one preferred embodiment of another aspect, the present invention, in a redundancy method of a semiconductor memory device including a plurality of memory cell array banks, a plurality of memory cell array blocks of each of the memory cell array banks, and a plurality of partial blocks of each of the memory cell array blocks connected to each of a plurality of data input/output line pairs and a predetermined number of redundant partial blocks of each of the memory cell array blocks connected to each of a predetermined number of redundant data input/output line pairs, includes an address setting step of setting a redundant control signal and defective addresses of each of the memory cell array blocks, a decoding and shifting control signal generation step for generating a plurality of shifting control signal for controlling shifting of the data input/output line pairs and of the redundant data input/output line pairs by decoding the defective address, and a switching step of outputting data output from a data input/output line pair adjacent to a corresponding data input/output line pairs in response to each of the shifting control signals and of inputting input data to a data input/output line pair adjacent to the corresponding data input/output line pair.

In another preferred embodiment of another the present invention, in a redundancy method of a semiconductor memory device including a plurality of memory cell array banks, a plurality of memory cell array blocks of each of the memory cell array banks, a plurality of partial blocks of each of the memory cell array blocks connected to each of a plurality of data input/output line pairs, a predetermined number of redundant partial blocks of each of the memory cell array blocks connected to each of a predetermined number of redundant data input/output line pairs, a plurality of partial blocks according to a column address group of each of the partial blocks and a predetermined number of redundant partial blocks according to a column address group of each of a predetermined number of redundant partial blocks, includes a control signal generation step of generating selection control signals by column address groups for selecting a plurality of partial blocks according to the column address group in response to an automatic refresh command, an address setting step for setting redundant control signal by column address groups and defective address in response to the selection control signal by column address groups, a step of generating a plurality of shifting control signals for controlling shifting of the data input/output line pairs and the redundant data input/output line pairs by decoding the redundant control signal and the defective address, and a switching step of outputting data output from a data input/output line pair adjacent to a corresponding data input/output line pair in response to each of the shifting control signals and of inputting input data to a data input/output line pair adjacent to the corresponding data input/output line pair.

DETAILED DESCRIPTION OF PREFERRED EMBODIMENTS

A semiconductor memory device and redundancy method of the present invention is described as follows with reference to the accompanying drawings.

Figure 1:
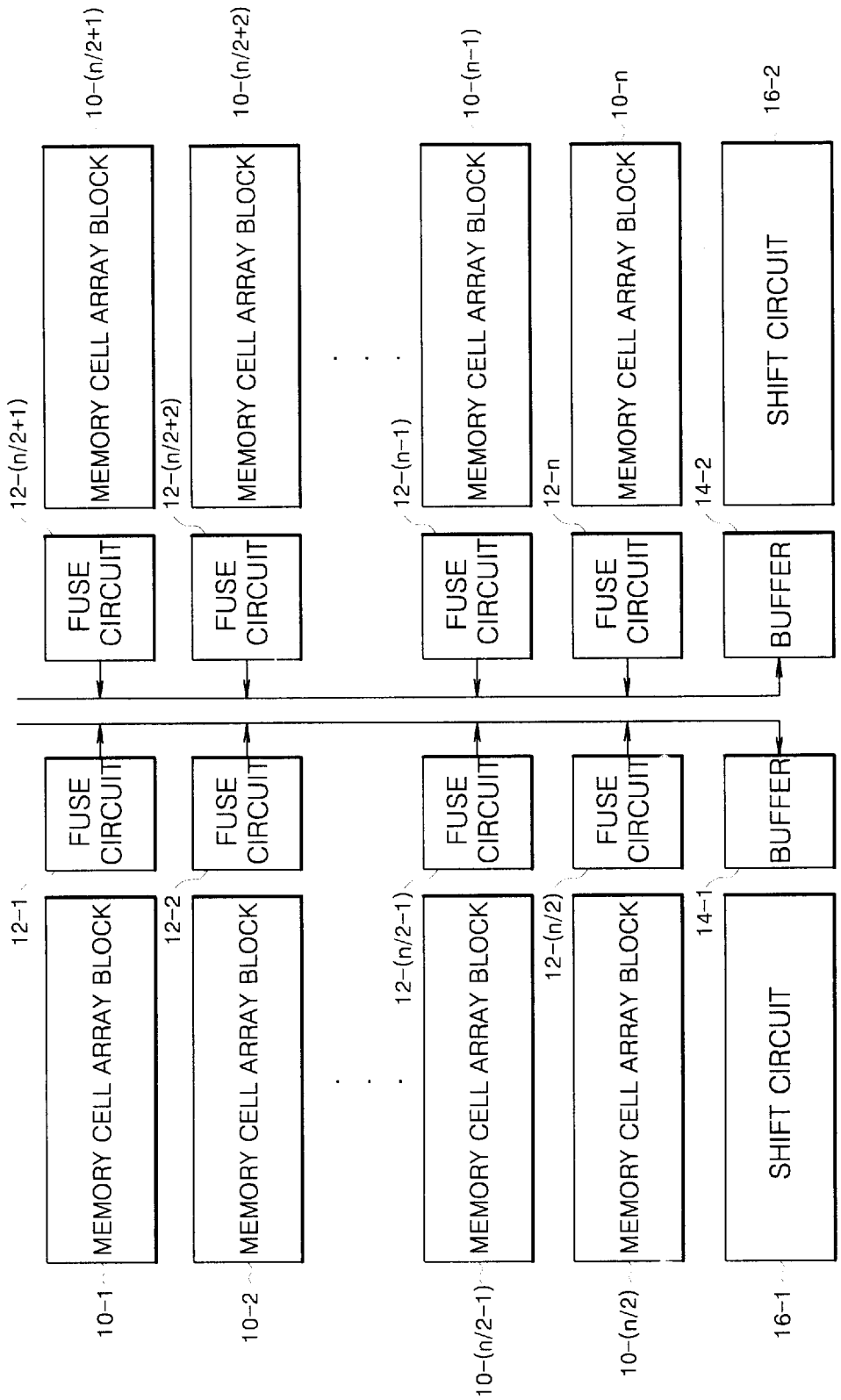
FIG. 1 is a block diagram of an embodiment of a prior semiconductor memory device.
Figure 2:
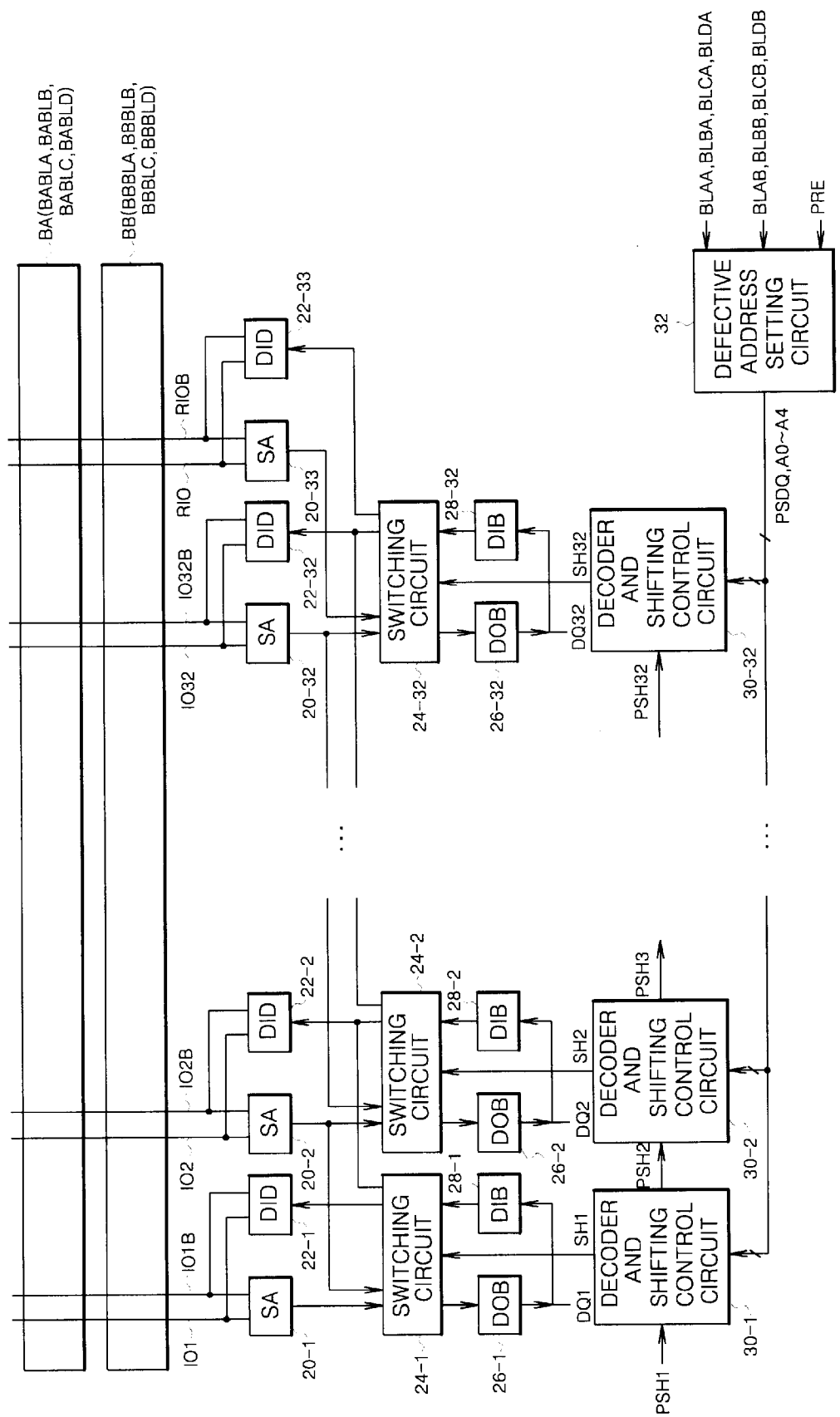
FIG. 2 is a block diagram of an embodiment of a semiconductor memory device of the present invention.

FIG. 2 is a block diagram of an embodiment of a semiconductor memory device in accordance with an embodiment of the present invention. The device includes two memory cell array banks BA and BB, sense amplifiers 20-1 to 20-33, data input drivers 22-1 to 22-33, switching circuits 24-1 to 24-32, data output buffers 26-1 to 26-32, data input buffers 28-1 to 28-32, decoder and shifting control circuits 30-1 to 30-32, and an address setting circuit 32.

Each memory cell array bank BA or BB includes four memory cell array blocks BABLA, BABLB, BABLC, and BABLD or BBBLA, BBBLB, BBBLC, and BBBLD. The operation of each of the blocks shown in FIG. 2 is described as follows.

Memory cell array blocks BABLA, BABLB, BABLC, BABLD, BBBLA, BBBLB, BBBLC, and BBBLD of memory cell array banks BA and BB are enabled in response to respective block signals BABLA, BABLB, BABLC, BABLD, BBBLA, BBBLB, BBBLC, and BBBLD. Sense amplifiers 20-1 to 20-33 amplify and output data from each of data input/output line pairs (IO1, IO1B) to (IO32, IO32B) and (RIO, RIOB). Data input drivers 22-1 to 22-33 drive input data to data input/output line pairs (IO1, IO1B) to (IO32, IO32B) and (RIO, RIOB) respectively. Switching circuits 24-1 to 24-32 respond to respective shifting control signals SH1 to SH32 by selecting data output from corresponding sense amplifiers 20-1 to 20-32 or data output from adjacent sense amplifiers 20-2 to 20-33 during a read operation. During a write operation, switching circuits 24-1 to 24-32 output input data to corresponding data input drivers 22-1 to 22-32 or adjacent data input drivers 22-2 to 22-33. Data output buffers 26-1 to 26-32 buffer data output from each of switching circuits 24-1 to 24-32. Data input buffers 28-1 to 28-32 buffer data input from external circuitry and output buffered data to switching circuits 24-1 to 24-32 respectively. Each of decoder and shifting control circuits 30-1 to 30-32 decodes a redundant control signal PSDQ and defective address A0–A4 respectively and generates shifting control signals SH1 to SH32 respectively in response to each of signals PSH1 to PSH32 output from a previous stage. An address setting circuit 32 sets a redundant control signal PSDQ and a defective address A0–A4 in response to each of select signals BLAA, BLBA, BLCA, BLDA, BLAB, BLBB, BLCB and BLDB. Each of select signals BLAA, BLBA, BLCA, and BLDA is a signal generated by ANDing a signal RBA generated using a bank signal BA in row active and each of block signals BABLA, BABLB, BABLC and BABLD, and each of select signals BLAB, BLBB, BLCB and BLDB is a signal generated by ANDing a signal RBB generated using a bank signal BB in row active and each of block signals BBBLA, BBBLB, BBBLC and BBBLD.

Figure 3:
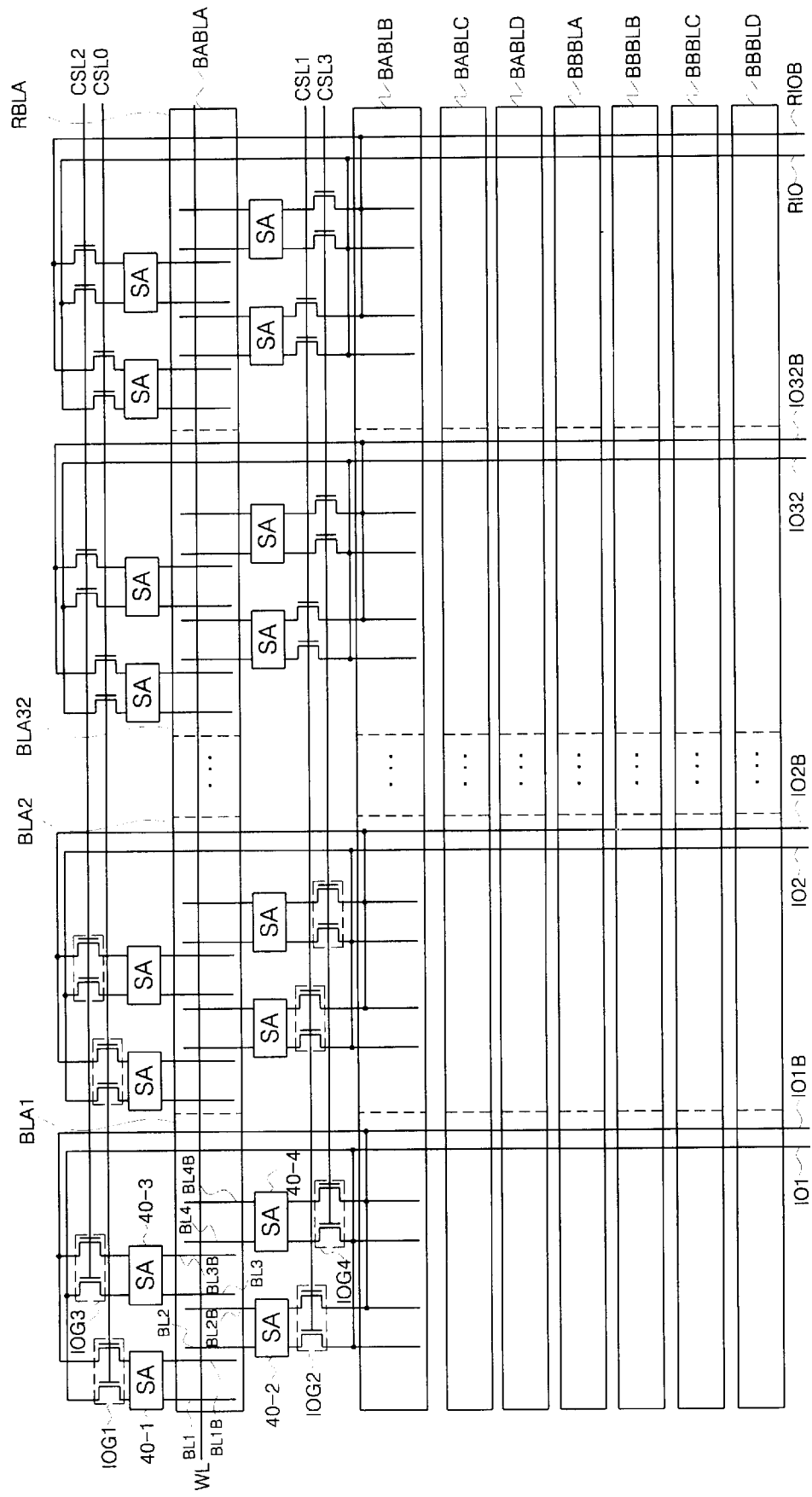
FIG. 3 shows a configuration of an embodiment of a memory cell array shown in FIG. 2.

FIG. 3 shows a configuration of an embodiment of a memory cell array shown in FIG. 2. The array has a construction in which memory cell array blocks BABLA, BABLB, BABLC and BABLD of a memory cell array bank BA and memory cell array blocks BBBLA, BBBLB, BBBLC and BBBLD of a memory cell array bank BB are arranged in a column direction.

Word lines WL of each of memory cell array blocks BABLA, BABLB, BABLC, BABLD, BBBLA, BBBLB, BBBLC and BBBLD are arranged in a row direction, and bit lines BL are arranged in the column direction (perpendicular to the word lines WL). Two column select signal lines CSL0 and CSL2 shared between memory cell array blocks are parallel to word lines WL, and data input/output line pairs (IO1, IOB) to (IO32, IO32B) and (RIO, RIOB) are perpendicular to the word lines. In FIG. 3, a word line WL is a representative word line.

A partial block BLA1 of a memory cell array block BABLA connected to data input/output line pair IO1 and IO1B includes sense amplifiers 40-1, 40-2, 40-3 and 40-4 and data input/output gates IOG1, IOG2, IOG3 and IOG4. Sense amplifiers 40-1, 40-2, 40-3 and 40-4 connect to respective bit line pairs (BL1, BL1B), (BL2, BL2B), (BL3, BL3B) and (BL4, BL4B). Data input/output gates IOG1, IOG2, IOG3 and IOG4 are between data I/O line pair IO1 and IO1B and respective sense amplifiers 40-1, 40-2, 40-3 and 40-4 and are controlled by column select signal lines CSL0, CSL1, CSL2 and CSL3 respectively. The configuration of other partial blocks BLA2 to BLA32 and RBLA of a memory cell array block BABLA is the same as the configuration of a partial block BLA1. Also, the configuration of partial blocks of other memory cell array blocks BABLB, BABLC, BABLD, BBBLA, BBBLB, BBBLC and BBBLD having no marks is the same as the configuration of a partial block BLA1.

The memory cell array block shown in FIG. 3 operates as follows.

If a block signal BABLA is enabled and a column select signal CSL0 transitions to "high", the data input/output gates IOG1 of partial blocks BLA1 to BLA32 and RBLA of a memory cell array block BABLA are selected. If memory cell array block BABLA is defect free, a write operation transmits data via data input/output line pairs (IO1, IO1B) to (IO32, IO32B) through sense amplifiers 40-1 to a bit line pairs (BL1, BL1B) in each partial block BLA1 to BLA32. In read operation, sense amplifiers 40-1 transmit data from bit line pairs (BL1, BL1B) to data input/output line pairs (IO1, IO1B) to (IO32, IO32B).

If there is a defect in a partial block BLA1 of a memory cell array block BABLA, data is not inputted or outputted to or from data input/output line pairs (IO1, IO1B) to (IO32, IO32B) but is inputted or outputted to or from data input/output line pairs (IO2, IO2B) to (IO32, IO32B) and (RIO, RIOB).

Figure 4:
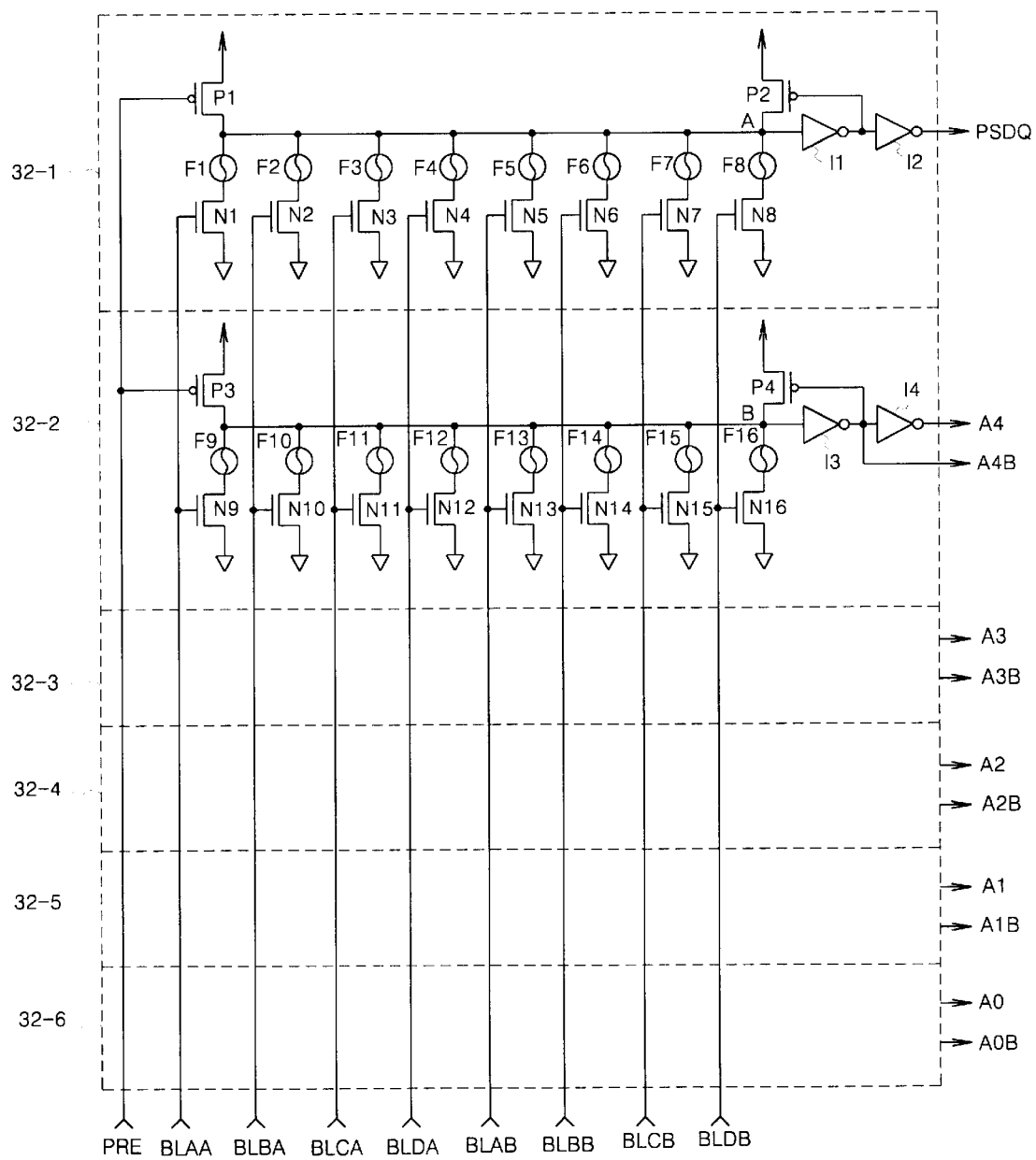
FIG. 4 is a circuit diagram of an embodiment of an address setting circuit shown in FIG. 2.

FIG. 4 is a circuit diagram of an embodiment of address setting circuit 32 shown in FIG. 2. In this embodiment, address setting circuit 32 includes a redundant control signal setting circuit 32-1 and address setting circuits 32-2, 32-3, 32-4, 32-5 and 32-6.

Redundant control signal setting circuit 32-1 includes PMOS transistors P1 and P2, NMOS transistors N1, N2, N3, N4, N5, N6, N7 and N8, fuses F1, F2, F3, F4, F5, F6, F7 and F8, and inverters I1 and I2 which operate as follows.

In applying a bank active command, a precharge signal PRE transitions to "low", causing PMOS transistor P1 to turn on and raise a node A to a "high" level. Inverters I1 and I2 cause a delay raising a redundant control signal PSDQ to "high". A PMOS transistor P2 turns on in response to an output signal of an inverter I1 being "low" and latches a "high" level signal of the node A.

When redundancy is not needed, the redundant control signal setting circuit 32-1 drops signal PSDQ to "low", which corresponds to a "low" level signal on the node A. This occurs if one of the select signals BLAA, BLBA, BLCA, BLDA, BLAB, BLBB, BLCB and BLDB has a corresponding fuse F1 to F8 that is not cut, so that one of transistors N1 to N8 turns on and pulls node A to "low". Inverters I1 and I2 delay pulling the redundant control signal PSDQ to "low" in response to a "low" level signal at node A.

If memory cell array block BABLA of a memory cell array bank BA and memory cell array block BBBLB of a memory cell array bank BB shown in FIG. 2 contain defects, fuses F1 and F6 connected to NMOS transistors N1 and N6 to which select signals BLAA and BLBB are applied are cut. Accordingly, if select signal BLAA or BLBB transitions to "high", redundant control signal PSDQ remains "high" as latched by an inverter I1 and a PMOS transistor P2.

Each of address setting circuits 32-2, 32-3, 32-4, 32-5 and 32-6 includes PMOS transistors P3 and P4, NMOS transistors N9, N10, N11, N12, N13, N14, N15 and N16, fuses F9, F10, F11, F12, F13, F14, F15 and F16, and inverters I3 and I4. The configuration of address setting circuits 32-2, 32-3, 32-4, 32-5 and 32-6 is the same as the configuration of redundant control signal setting circuit 32-1. If the redundant control signal PSDQ indicates a redundancy replacement is required, address setting circuits 32-2, 32-3, 32-4, 32-5 and 32-6 generate a multi-bit address signal [A4:A0] identifying which partial block in the currently selected memory cell array block is defective. The value of address signal [A4:A0] typically depends on which of the memory cell array blocks is asserted.

The operation of address setting circuits is described as follows.

In case that redundancy is not needed, none of fuses F9 to F16 are cut. Accordingly, address setting circuits generates a "low" level signal to a node B when any one of select signals BLAA, BLBA, BLCA, BLDA, BLAB, BLBB, BLCB and BLDB is selected. The circuit consisting of inverters I1 and I2 delays generation of an address A0, A1, A2, A3, or A4 of "low" level and an inversion address of "high" level A0B, A1B, A2B, A3B, or A4B.

If redundancy is used for a particular block, then the corresponding fuse in redundant control signal setting circuit 32-1 is cut, and in each address setting circuit, the fuse that corresponds to that block is cut or not as required for the address setting circuits provide address [A4:A0] with a value that indicates the partial block being replaced. For example, if block BABLA contains a defect, fuse F1 is cut, and fuses F9 are cut or not as required to identify which of partial blocks BLA1 to BLA32 contains the defect. If there is a defect in partial block BLA1 (an address [A4:A0] equal to 00000b) of a block BABLA of a memory cell array bank BA, the fuse F1 is cut to indicate use of redundancy, but to provide the address 00000b, none of the fuses F9 are cut. If instead partial block BLA2 is defective (an address "00001") of a block BABLB of a memory cell array bank BA, the fuse F1 is cut to indicate use of redundancy, and fuse F9 is cut in address setting circuit 32-6 but none of the other address setting circuits 32-2 to 32-5. Similarly, for blocks BABLB, BABLC, BABLD, BBBLA, BBBLB, BBBLC, and BBBLD, the respective fuses F2, F3, F4, F5, F6, F7, and F8 are cut to activate a redundancy replacement and respective fuses F10, F11, F12, F13, F14, F15, and F16 are cut or not according to the partial block that is defective in the respective blocks.

Figure 5:
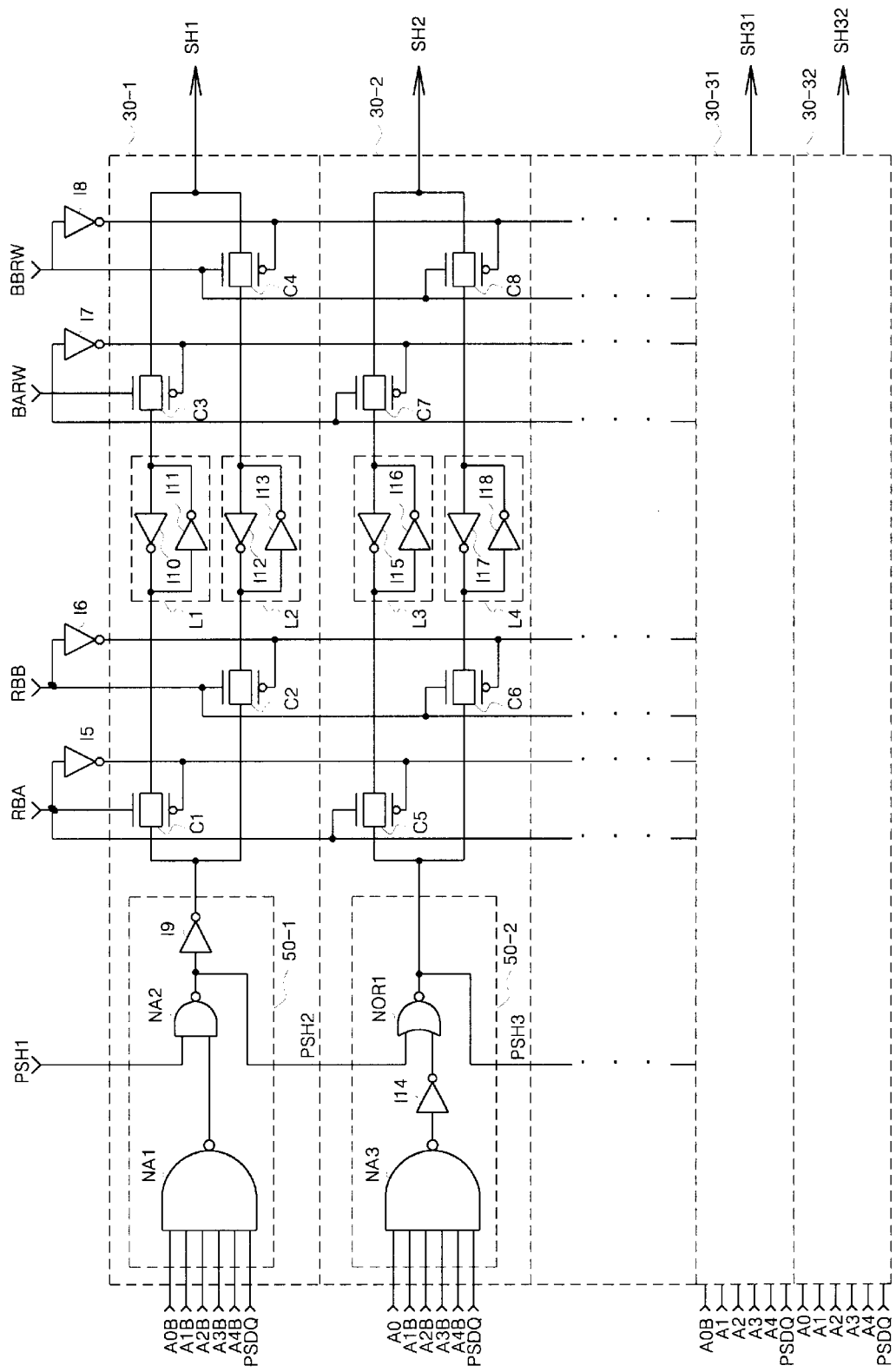
FIG. 5 is a circuit diagram of an embodiment of a decoder and shifting control circuit shown in FIG. 2.

FIG. 5 is a circuit diagram of an embodiment of decoder and shifting control circuits 30-1 to 30-32 shown in FIG. 2. In FIG. 5, an odd numbered decoder and shifting control circuit 30-1 includes a decoder 50-1, CMOS transmission gates C1 and C2, latches L1 and L2, and CMOS transmission gates C3 and C4. Decoder 50-1 includes NAND gates NA1 and NA2 and an inverter I9. CMOS transmission gates C1 and C2 transmit an output signal of the decoder 50-1 in response to "high" level signals RBA and RBB, respectively. Latches L1 and L2 invert and latch an output signal of CMOS transmission gates C1 and C2. CMOS transmission gates C3 and C4 transmit an output signal of latch L1 or L2 as a shifting control signal SH1 in response to each of bank read/write signal BARW or BBRW. Inverters I5, I6. I7 and I8 invert respective bank signals BA and BB and bank read/write signals BARW and BBRW. The configuration of the other odd numbered decoder and shifting control circuits 30-3, 30-5, . . . and 30-31 is the same as the configuration of the decoder and shifting control circuit 30-1.

An even numbered decoder and shifting control circuit 30-2 includes a decoder 50-2, CMOS transmission gates C5 and C6, latches L3 and L4, and CMOS transmission gates C7 and C8. Decoder 50-2 includes a NAND gate NA3, an inverter I14, and a NOR gate NOR1. CMOS transmission gates C5 and C6 transmit an output signal of the decoder 50-2 in response to each of "high" level signals RBA and RBB, respectively. Latches L3 and L4 invert and latch an output signal of CMOS transmission gates C5 and C6. CMOS transmission gates C7 and C8 transmit an output signal of latch L3 or L4 to a shifting control signal SH2 in response to each of bank read/write signal BARW or BBRW being at a "high" level. The configuration of the other even numbered decoders and shifting control circuits 30-4, 30-6, . . . and 30-32 is the same as the configuration of the decoder and shifting control circuit 30-2.

The circuit shown in FIG. 5 operates as follows.

In case that redundancy is not needed, signal PSDQ is low, and the output signal of NAND gates NA1 or NA3 in each of decoder and shifting control circuits 30-1 to 30-32 goes to the "high" level. Additionally, a signal PSH1 is preset to a "high" level, so that the output of NAND gate NA2 goes to the "low" level.

The circuit consisting of a NAND gate NA2 and an inverter I9 of odd numbered decoder and shifting control circuits 30-1, 30-3, . . . and 30-31 generates a "high" level signal. Each of CMOS transmission gates C1 and C2 transmits a "high" level signal in response to each of "high" level signals RBA and RBB. Each of latches L1 and L2 generates a "low" level signal by inverting and latching a "high" level signal. Each of CMOS transmission C3 and C4 generates a "low" level signal for the respective one of the odd numbered shifting control signals SH1 to SH31 in response to each of bank read/write signals BARW and BBRW of "high" level.

Each inverter I14 of even numbered decoders and shifting control circuits 30-2, 30-4, . . . and 30-32 generates a "low" level signal by inverting an output signal of a NAND gate NA2 of "high" level. Accordingly, each NOR gate NOR1 generates a "high" level signal by NORing an output signal (one of even numbered signals PSH2 to PSH32) of a preceding odd numbered decoder and shifting control circuit. For example, in the second decoder and shifting control circuit, NOR gate NOR1 produces a "high" level output signal because signal PSH2 from the NAND gate NA2 has a "low" level and an output signal of the inverter I14 has a "low" level. Each of CMOS transmission gates C5 and C6 transmits a "high" level signal in response to each of the "high" level signals RBA and RBB. Latches L3 and L4 generate a "low" level signal by inverting and latching a "high" level signal. Each of CMOS transmission gates C7 and C8 generates a "low" level signal for the respective one of the even numbered shifting control signals SH2 to SH32 in response to each of bank read/write signal BARW and BBRW of a "high" level.

To illustrate operation when redundancy is required, the following description uses an example where an address "00000" of a block BABLA of a memory cell array bank BA and an address "00001" of a block BBBLB of a memory cell array bank BB are defective. With these defects, a redundancy control signal PSDQ of a "high" level and an address A4A3A2A1A0 "00000" are generated from an address setting circuit 32 if a select signal BLAA is generated. With this combination, all NAND gates NA1 or NA3 except NAND gate NA1 in the first decoder and shifting control circuits 30-1 generate high output signals. In the first decoder and shifting control circuits 30-1, NAND gate NA1 generates a low output NAND gate NA2 generates a high output signal PSH2, and inverter I9 generates a low output signal. In response to the signal from NAND gates NA2 in a preceding odd numbered decoder and shifting control circuit being high, each NOR gate NOR1 in even numbered decoder and shifting control circuits 30-2, 30-4, . . . 30-32 generates a low output signal, causing the NAND gates NA2 in the next (odd numbered) shifting control circuits 30-3 to 30-31 to generate a high output signal. Accordingly, since the NAND gate NA2 in the first odd numbered shifting control circuits 30-1 is high, all output signals of decoders 50-1 and 50-2 of decoder and shifting control circuits 30-1, 30-2 to 30-32 are low. Therefore, each of CMOS transmission gates C1 and C5 of decoders and shifting control circuits 30-1 to 30-32 turns on in response to a "high" level signal RBA and transmits a "low" level signal. Each of latches L1 and L3 generates a "high" level signal by inverting and latching a "low" level signal. CMOS transmission gates C3 and C7 output respectively the "high" level signal latched by latches L1 and L3 to shifting control signals SH1 to SH32 in response to a bank read/write signal BARW of a "high" level.

If the memory has the example defects and a select signal BLBB is activated, address setting circuit 32 generates redundancy control signal PSDQ at a "high" level and an address "00001". An output signal of a decoder 50-1 of a decoder and shifting control circuit 30-1 goes to a "high" level, and an output signal of a decoder 50-2 of decoders and shifting control circuits 30-2 to 30-32 go to a "low" level. A CMOS transmission gate C2 of a decoder and shifting control circuit 30-1 is turned on in response to a "high" level signal RBB and transmits a "high" level signal, and a latch L2 generates a "low" level signal by inverting and latching a "high" level signal. A CMOS transmission gate C4 outputs the "low" level signal latched by the latch L2 to a shifting control signal SH1 in response to a bank read/write signal BAWR of a "high" level. CMOS transmission gates C2 and C6 of decoder and shifting control circuits 30-2 to 30-32 are turned on in response to a "high" level signal RBB and transmit a "low" level signal, respectively, and each of latches L2 and L4 generates a "high" level signal by inverting and latching a "low" level signal. CMOS transmission gates C4 and C8 of the even numbered decoder and shifting control circuits 30-2 to 30-32 output the "high" level signal latched by latches L2 and L4 to shifting control signals SH2 to SH32.

Figure 6:
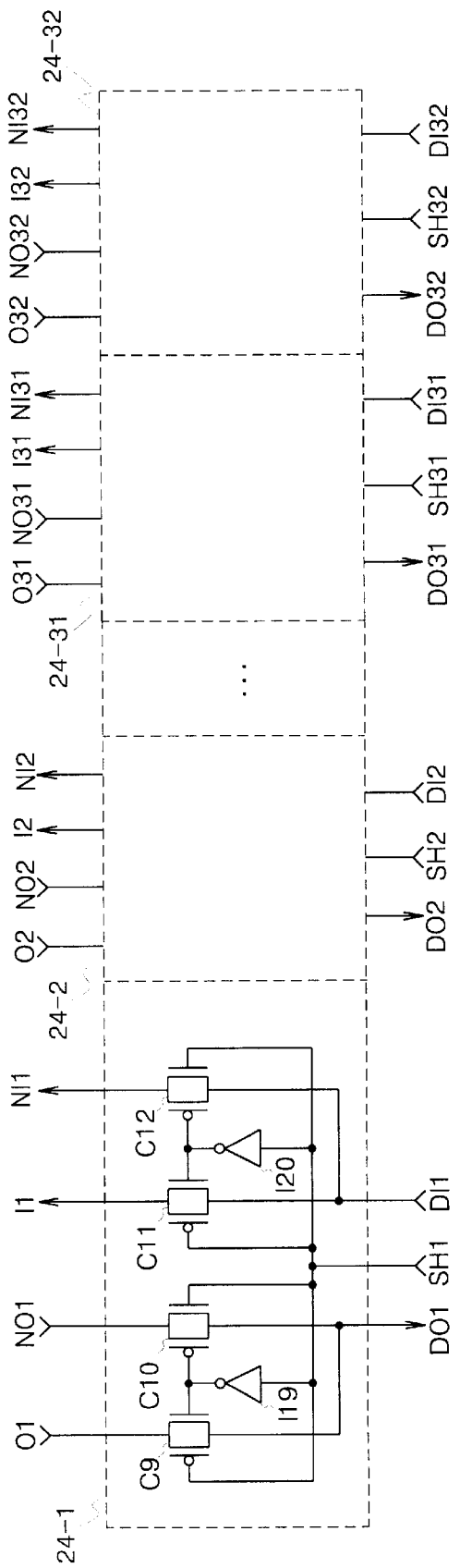
FIG. 6 is a circuit diagram of an embodiment of a switching circuit shown in FIG. 2.

FIG. 6 is a circuit diagram of an embodiment of a switching circuit shown in FIG. 2, each of switching circuits includes CMOS transmission gates C9, C10, C11 and C12, and inverters I19 and I20.

The operation of a circuit shown in FIG. 6 is described as follows.

If a shifting control signal SH1 is at a "low" level, CMOS transmission gates C9 and C11 are turned on and data O1 output from a sense amplifier 20-1 is an output data DO1, and an input data DI1 is an input data I1 applied to a data input driver 22-1.

If the shifting control signal SH1 is high, CMOS transmission gates C10 and C12 turn Accordingly, data NO1 output from a sense amplifier 20-2 is output data DO1, and an input data DI1 is an input data NI1 applied to data input driver 22-2.

In summary, switching circuit 24-1 shown in FIG. 6 routes input or output data DI1 or DO0 via data input driver 22-1 or sense amplifier 20-1 to or from data input/output line pair IO1 and IO1B if signal SH1 is low. Switching circuit 24-1 routes input or output data DI1 or DO1 via the next sense amplifier 20-2 or the next data input driver 22-2 to or from the next data input/output line pair IO1 and IO1B if signal SH1 is high.

The operation of the other switching circuits 24-2 to 24-32 is the same as the operation of switching circuit 24-1.

In the switching circuit of FIG. 6, if a shifting control signal of one stage is high, all shifting control signals thereafter are high. Accordingly, a data input/output line pair connected to a defective memory cell is replaced with an adjacent data input/output line pair. That is, data input/output line pairs starting with a data input/output line pair connected to a defective memory cell are replaced respectively with adjacent data input/output line pairs up to a redundant data input/output line pair.

Figure 7:
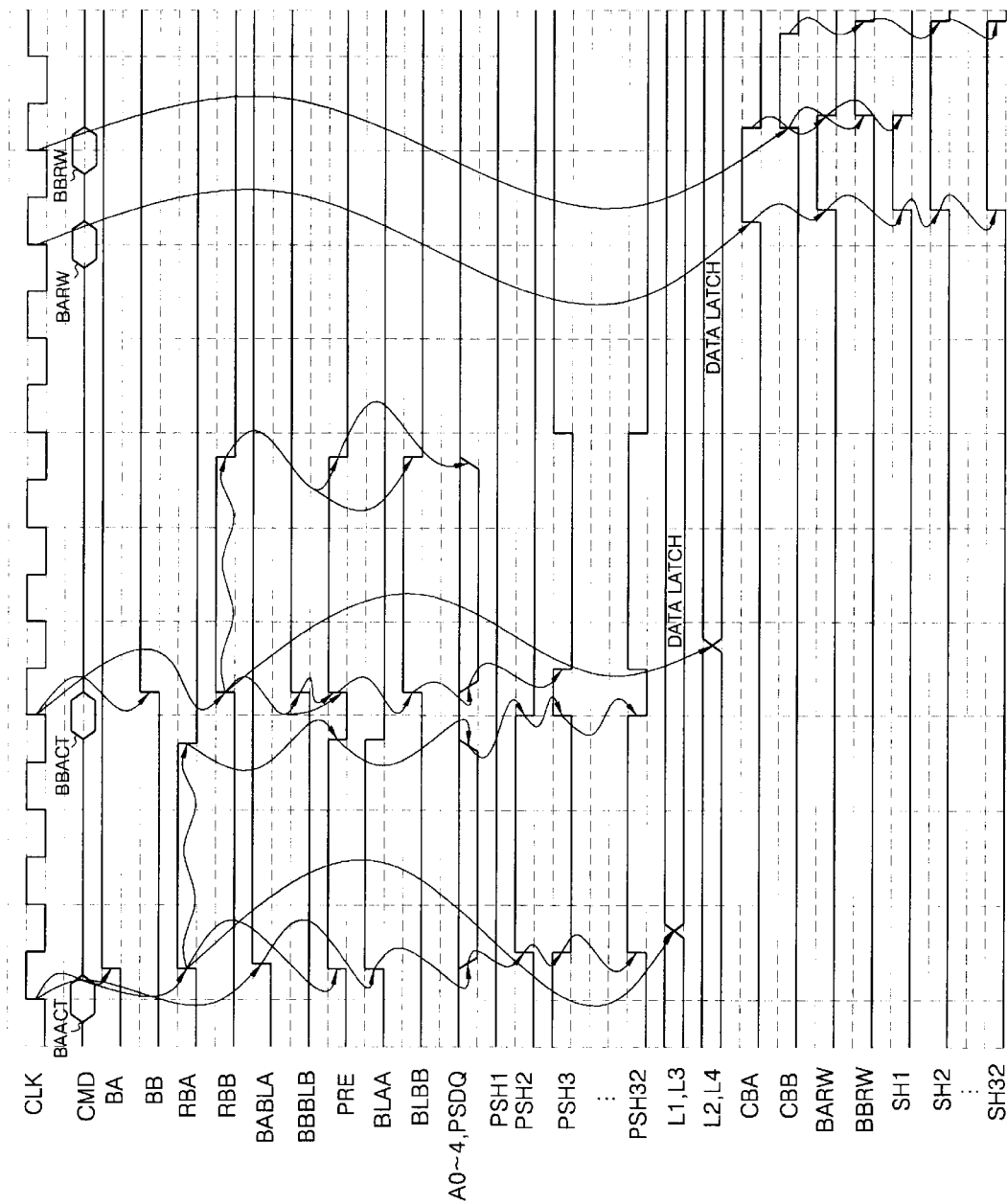
FIG. 7 is an operational timing diagram to illustrate the operation of a semiconductor memory device shown in FIG. 2.

FIG. 7 is an operational timing diagram to illustrate the operation of a semiconductor memory device shown in FIG. 2, when a delay time tRRD from the generation of a row strobe signal to the generation of a next row strobe signal is 3 cycles of a clock signal CLK, and there are defects at an address "00000" of a memory cell array block BABLA of a memory cell array bank BA and an address "00001" of a memory cell array block BLB of a memory cell array bank BB.

In a row cycle, if a bank active command BAACT for activating a memory cell array bank BA is applied, a bank signal BA transits high, and if a bank active command BBACT for activating a memory cell array bank BB follows after delay time tRRD, a bank signal BB subsequently transits to high.

Signals RBA and RBB transit to high in response to the transition of bank signals BA and BB to high and transit to low after a predetermined time.

If block signals BABLA and BBBLB are asserted when applying bank signals BA and BB, select signals BLAA and BLBB of a "high" level are generated by ANDing of the signals RBA and RBB and the block signals BABLA and BBBLB.

Redundant control signal setting circuit 32-1 of address setting circuit 32 is precharged in response to precharge signals PRE being low when bank active signals BAACT and BBACT are generated. Redundant control signal setting circuit 32-1 asserts redundant control signal PSDQ to high in response to either of select signals BLAA and BLBB being high. Also, address setting circuits 32-2, 32-3, 32-4, 32-5 and 32-6 of the address setting circuit 32 generate address [A4:A0] having values "00000" and "00001" in response to select signals BLAA and BLBB, respectively.

While select signal BLAA is activated to high, decoders 50-1 and 50-2 of decoder and shifting control circuits 30-1 to 30-32 generate "high" level signals PSH2 to PSH32 respectively and generate "low" level signals PSH3, PSH5, ... and PSH31, since signal PSH1 is high. While select signal BLBB is activated to high, decoders 50-1 and 50-2 of decoder and shifting control circuits 30-1 to 30-32 generate "low" level signals PSH2, PSH3, PSH5, ... and PSH31 and "high" level signals PSH4, PSH6, ... and PSH32, since signal PSH1 is at "high" level.

If a bank signal RBA is high, "low" level signals of decoders 50-1 and 50-2 of decoder and shifting control circuits 30-1 to 30-32 are latched. If a bank signal RBB is high, a "high" level signal of a decoder 50-1 of a decoder and shifting control circuit 30-1 is latched, and "low" level signals of decoders 50-1 and 50-2 of decoder and shifting control circuits 30-2 to 30-32 are latched.

If in a column cycle a bank read/write command is applied and bank signals CBA and are applied, bank read/write signals BARW and BBRW are generated in response to bank signals CBA and CBB, respectively. In response to a bank read/write signal BARW of a "high" level, decoder and shifting control circuits 30-1 to 30-32 output latched "high" level data to shifting control signals SH1 to SH32, respectively. In response to a bank read/write signal BBRW of a "high" level, a decoder and shifting control circuit 30-1 outputs latched "low" level data to a shifting control signal SH1, and decoder and shifting control circuits 30-2 to 30-32 output latched "high" level data to shifting control signals SH2 to SH32 respectively.

Figure 8:
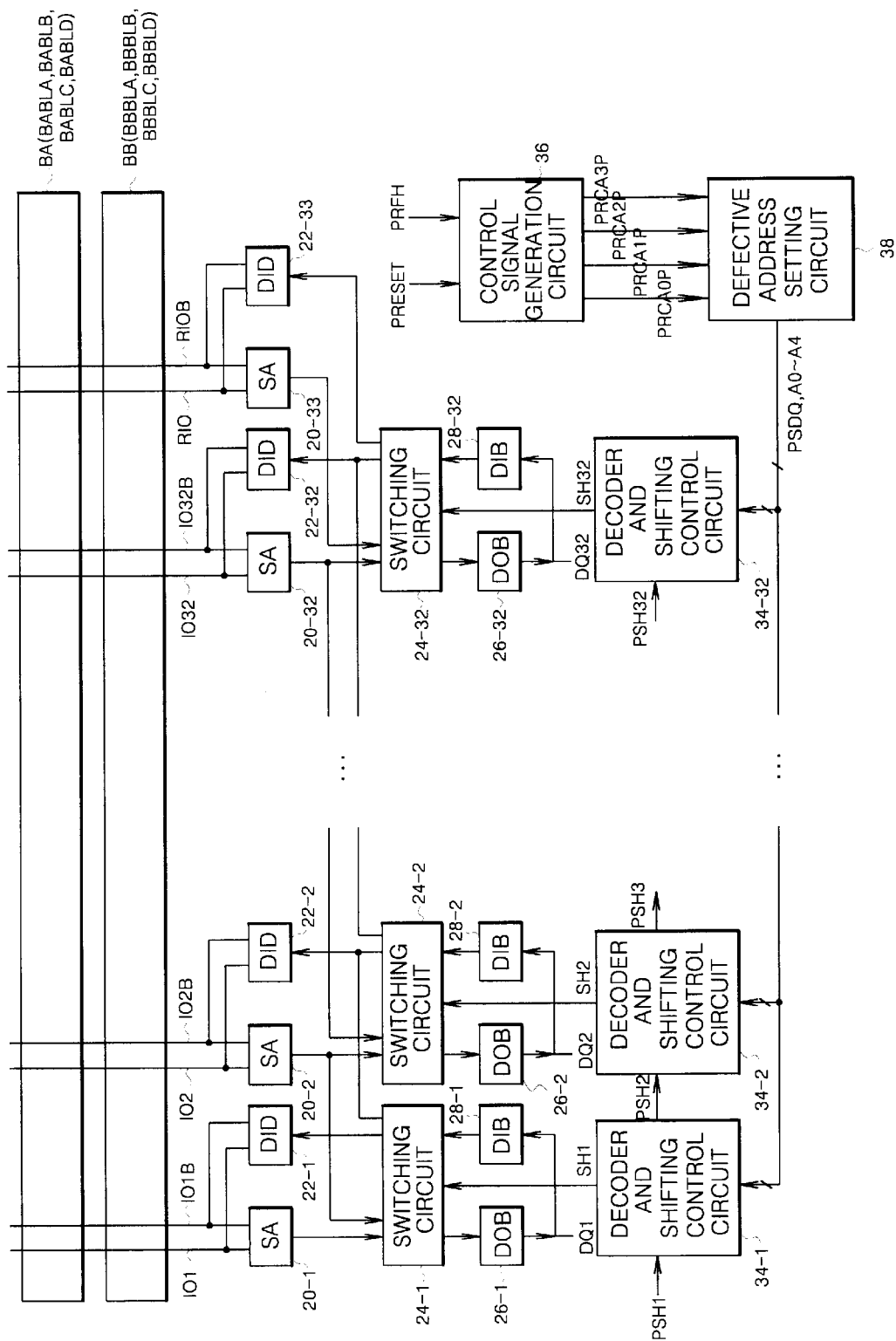
FIG. 8 is a block diagram of a semiconductor memory device of another embodiment of the present invention.

FIG. 8 is a block diagram of a semiconductor memory device in accordance with another embodiment of the present invention. The semiconductor memory device of FIG. 8 is the same as that of FIG. 2 except that decoders and shifting control circuits 34-1 to 34-32 respectively replace decoder and shifting control circuits 30-1 to 30-32, an address setting circuit 38 replaces address setting circuit 32, and the device of FIG. 8 further includes a control signal generating circuit 36.

A semiconductor memory device of FIG. 8 is an embodiment that performs redundancy operations by column address group. In FIG. 8, partial blocks of each of the memory cell array blocks can be divided into partial blocks by four column address groups by column select signals CSL0, CSL1, CSL2 and CSL3 generated by decoding the column address as shown in FIG. 3. That is, a partial block BLA1 can be divided into partial blocks by four column address groups connected to each of input/output gates IOG1, IOG2, IOG3 and IOG4.

Blocks in FIG. 8 having the same reference numbers as blocks in FIG. 2 has substantially the same structure as described above. Accordingly, that description is not repeated here. The function of the other blocks is described below.

A control signal generating circuit 36 resets in response to a preset signal PRESET and generates control signals PRCA0P, PRCA1P, PRCA2P and PRCA3P respectively in response to a dummy automatic refresh signal PRFH. Address setting circuit 38 sets a redundant control signal and a defective address in response to each of control signals PRCA0P, PRCA1P, PRCA2P and PRCA3P respectively. That is, the address setting circuit 38 sets a redundant control signal and a defective address respectively by column address group. Each of decoder and shifting control circuits 34-1 to 34-32 decodes the redundant control signal and the defective address and generate shifting control signals SH1 to SH32 in response to each of signals PSH1 to PSH32.

Figure 9:
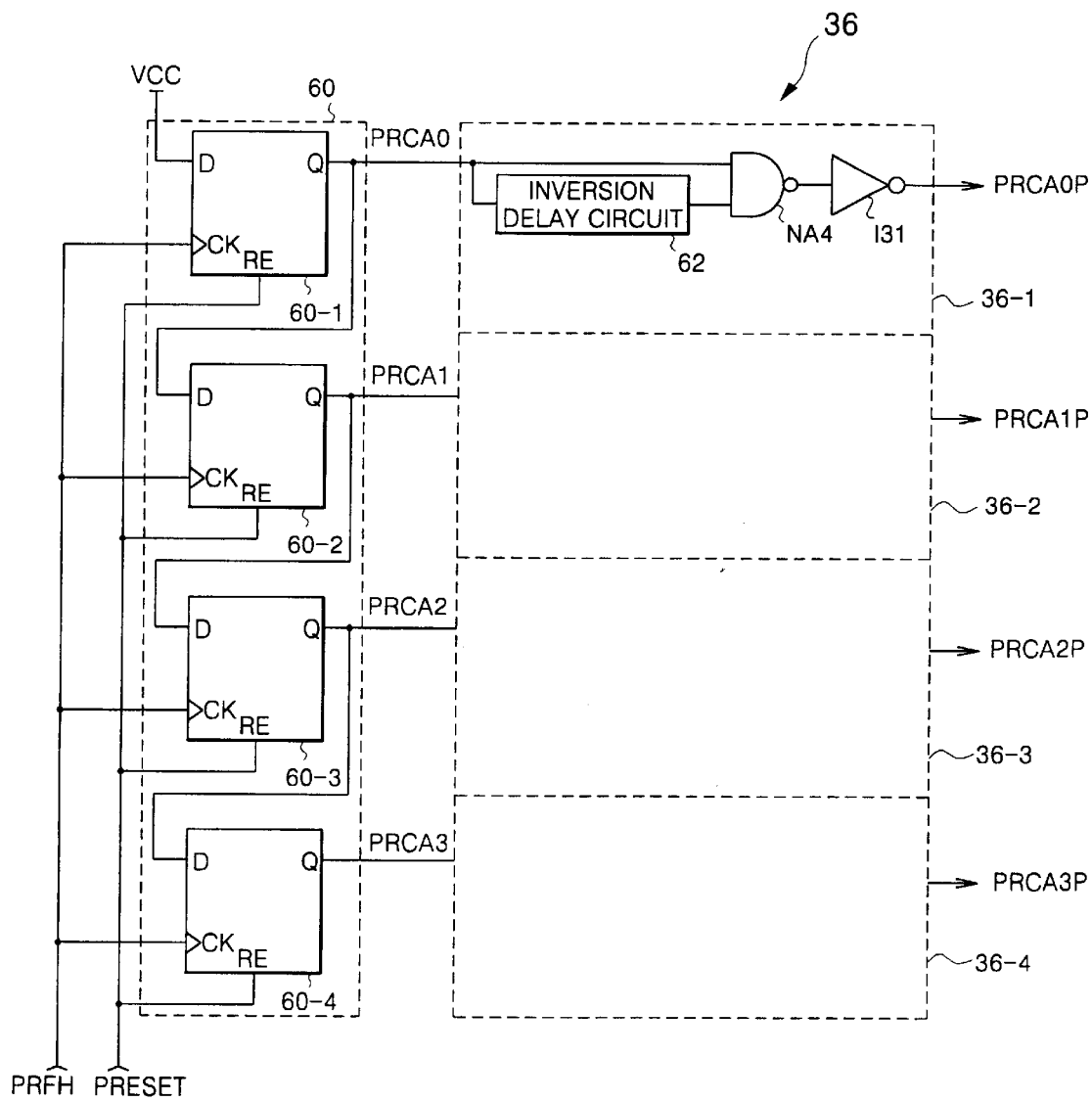
FIG. 9 is a circuit diagram of an embodiment of a control signal generating circuit shown in FIG. 8.

FIG. 9 is a block diagram of an embodiment of a control signal generating circuit 36 of FIG. 8. In this embodiment, control signal generating circuit 36 includes a signal generating circuit 60 and pulse generating circuits 36-1, 36-2, 36-3 and 36-4. Signal generating circuit 60 includes four serially connected D flip flops 60-1, 60-2, 60-3 and 60-4 for generating signals PRCA0, PRCA1, PRCA2 and PRCA 3. Pulse generating circuits 36-1, 36-2, 36-3 and36-4 receive input signals PRCA0, PRCA1, PRCA2 and PRCA3, respectively and generate pulsed signals PRCA0P, PRCA1P, PRCA2P and PRCA3P respectively. Each of pulse generating circuits 36-1, 36-2, 36-3 and 36-4 includes an inversion delay circuit 62, a NAND gate NA4 and an inverter I31.

The operation of the circuit of FIG. 9 is described as follows.

If a preset signal PRESET is applied, all output signals PRCA0, PRCA1, PRCA2 and PRCA3 of D flip flops 60-1, 60-2, 60-3 and 60-4 go to "0". D flip flops 60-1, 60-2, 60-3 and 60-4 latch a signal applied to a respective data input terminal D in response to a dummy automatic refresh signal PRFH at the "low" level, and output the latched signals to respective signals PRCA0, PRCA1, PRCA2 and PRCA3 in response to a dummy automatic refresh signal PRSH at the "high" level.

In pulse generating circuit 36-1, inversion delay circuit 62 delays a signal PRCA0 for a predetermined time and inverts the signal. A NAND gate NA4 and an inverter I31 output a "high" level control signal PRCA0P when signal PRCA0 from inversion delay circuit 62 transits to high. Signal PRCA0P remains high during the delay time of inversion delay circuit 62. Pulse generating circuits 36-2, 36-3 and 36-4 operate on respective signals PRCA1, PRCA2, and PRCA3 in the same manner that pulse generating circuit 36-1 operates on signal PRCA0.

Therefore, if signals PRCA0, PRCA1, PRCA2 and PRCA3 transit to "high" level, pulse generating circuits 36-1, 36-2, 36-3 and 36-4 generate respective control signals PRCA0P, PRCA1P, PRCA2P and PRCA3P that transition to low a predetermined time after transiting to high.

Figure 10:
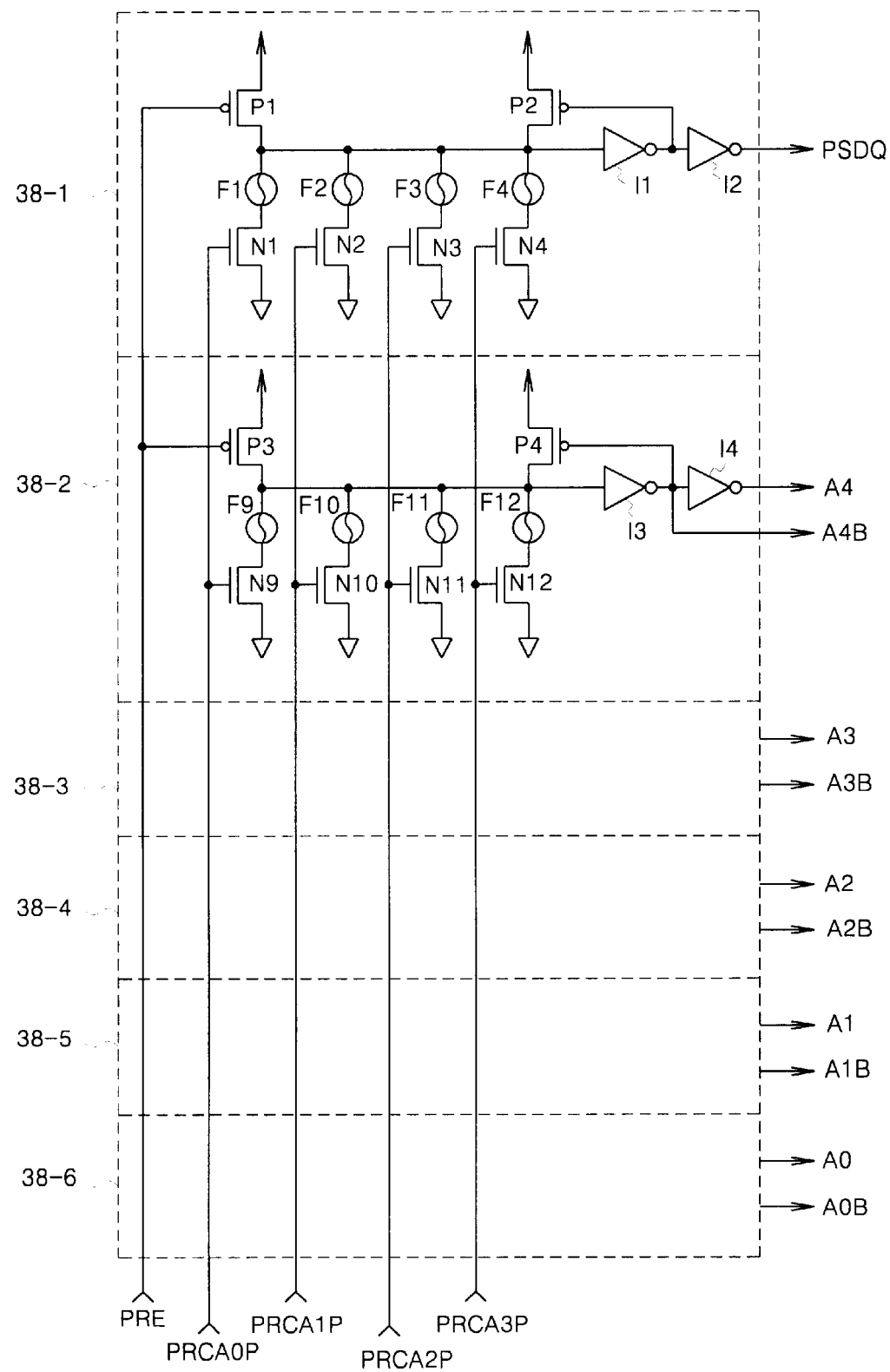
FIG. 10 is a circuit diagram of an embodiment of an address setting circuit shown in FIG. 8.

FIG. 10 is a circuit diagram of an embodiment of address setting circuit 38 of FIG. 8. The embodiment of FIG. 10 includes a redundant control signal setting circuit 38-1, and address setting circuits 38-2, 38-3, 38-4, 38-5 and 38-6.

Redundant control signal setting circuit 38-1 is basically an abbreviated form of redundant control signal setting circuit 32-1 of FIG. 4 that results from removing NMOS transistors N5, N6, N7 and N8 and fuses F5, F6, F7 and F8 from redundant control signal setting circuit 32-1.

Similarly, each of address setting circuits 38-2, 38-3, 38-4, 38-5 and 38-6 is an abbreviated form of address setting circuits 32-2, 32-3, 32-4, 32-5 and 32-6 of FIG. 4 that results from removing NMOS transistors N13, N14, N15 and N16 and fuses F13, F14, F15 and F16 from address setting circuit 32-2.

Additionally, select signals BLAA, BLBA, BLCA, BLDA, BLAB, BLBB, BLCA and BLDB are not applied to NMOS transistors of each of redundant control signal and address setting circuits 38-1, 38-2, 38-3, 38-4, 38-5 and 38-6. Instead, signals PRCA0P, PRCA1P, PRCA2P and PRCA3P are applied.

The address setting circuit of FIG. 10 sets a redundant control signal and a defective address of a corresponding column address group in response to select signals by virtual column address group, that is, control signals PRCA0P, PRCA1P, PRCA2P and PRCA3P generated in response to a dummy automatic refresh signal PRFH generated in power up.

The operation of a redundant control signal setting circuit 38-1 and address setting circuits 38-2, 38-3, 38-4, 38-5 and 38-6 is substantially the same as the operation of the redundant control signal setting circuit 32-1 and address setting circuits 32-2, 32-3, 32-4, 32-5 and 32-6 shown in FIG.4, and therefore the detailed description will be omitted.

For example, if a defective memory cell in the first column group is connected to data line pair "00000", and a defective memory cell in the second column group is connected to data line pair "00001", a repair operation cuts fuses F1 and F2 of a redundant control signal setting circuit 38-1 and a fuse F10 of an address setting circuit 38-6.

Figure 11:
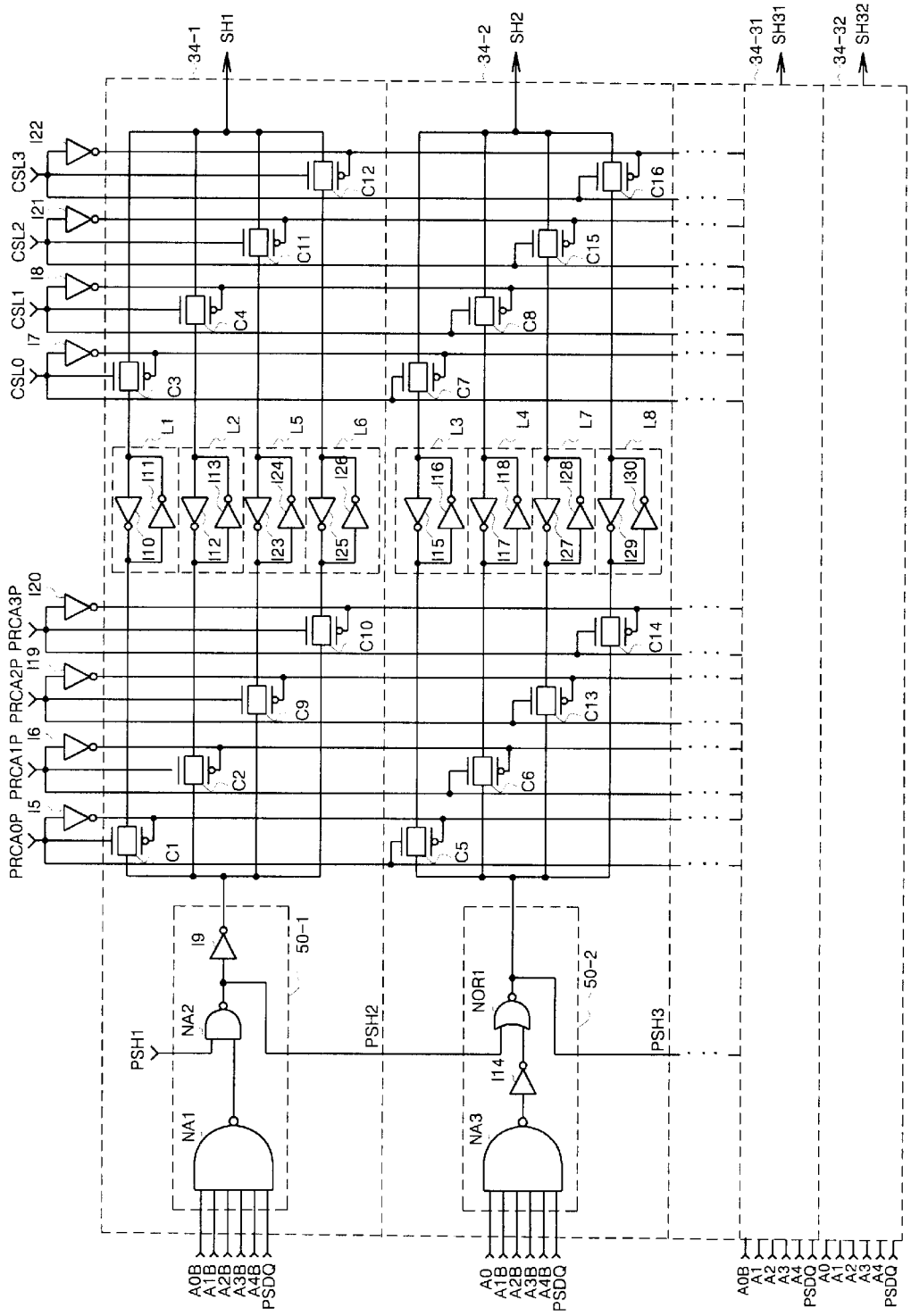
FIG. 11 is a circuit diagram of an embodiment of a decoder and shifting control circuit shown in FIG. 8.

FIG. 11 is a circuit diagram of an embodiment of decoder and shifting control circuits shown in FIG. 8. In this embodiment, the configuration of odd numbered decoder and shifting control circuits 34-1, 34-3, . . . and 34-31 results from adding CMOS transmission gates C9, C10, C11 and C12, a latch L5 including inverters I23 and I24, and a latch L6 including inverters I25 and I26 to the configuration of odd numbered shifting control circuit 30-1 of FIG. 5.

The configuration of each of even numbered decoder and shifting control circuits 34-2, 34-4, . . . and 34-32 results from adding CMOS transmission gates C13, C14, C15 and C16, a latch L7 including inverters I27 and I28, and a latch L8 including inverters I29 and I30 to the configuration of even numbered decoder and shifting control circuit 30-2 of FIG. 5. Additionally, the signals to the CMOS transmission gates in FIG. 11 differ from those in FIG. 5. Control signal PRCAOP is applied to CMOS transmission gates C1 and C5. Control signal PRCA1P is applied to CMOS transmission gates C2 and C6. Control signal PRCA2P is applied to CMOS transmission gates C9 and C13, and control signal PRCA2P is applied to CMOS transmission gates C10 and C14. Column select signal CSL0 is applied to CMOS transmission gates C3 and C7. Column select signal CSL1 is applied to CMOS transmission gates C4 and C8. Column select signal CSL2 is applied to CMOS transmission gates C11 and C15, and column select signal CSL3 is applied to CMOS transmission gates C12 and C16. Inverters I5, I6, I7 and I8 are described above in regard to FIG. 5, and inverters I19, I20, I21 and I22 invert control signals PRCA2P, PRCAP3, CSL2 and CSL3.

The circuit of FIG. 11 includes four sets of CMOS transmission gates and latches to store a defective address for each column address group.

The operation of the circuit of FIG. 11 is the same as the operation of the circuit of FIG. 5, and will be understood easily with reference to the above description of the operation of the circuit of FIG. 5.

Decoders 50-1 and 50-2 of decoder and shifting control circuits 34-1 to 34-31 generate signals PSH2 to PSH32, respectively. Decoder and shifting control circuits 34-1 to 34-32 invert and latch output signals of decoders 50-1 and 50-2 respectively in response to control signals PRCA0P, PRCA1P, PRCA2P and PRCA3P generated using a dummy automatic refresh signal PRFH generated in response to an automatic refresh command generated during 4 cycles during power up. Also, decoder and shifting control circuits 34-1 to 34-32 output the latched signal in response to each of column select signals CSL0, CSL1, CSL2 and CSL3 generated by decoding column address in column cycle to generate shifting control signals SH1 to SH32, respectively.

Figure 12:
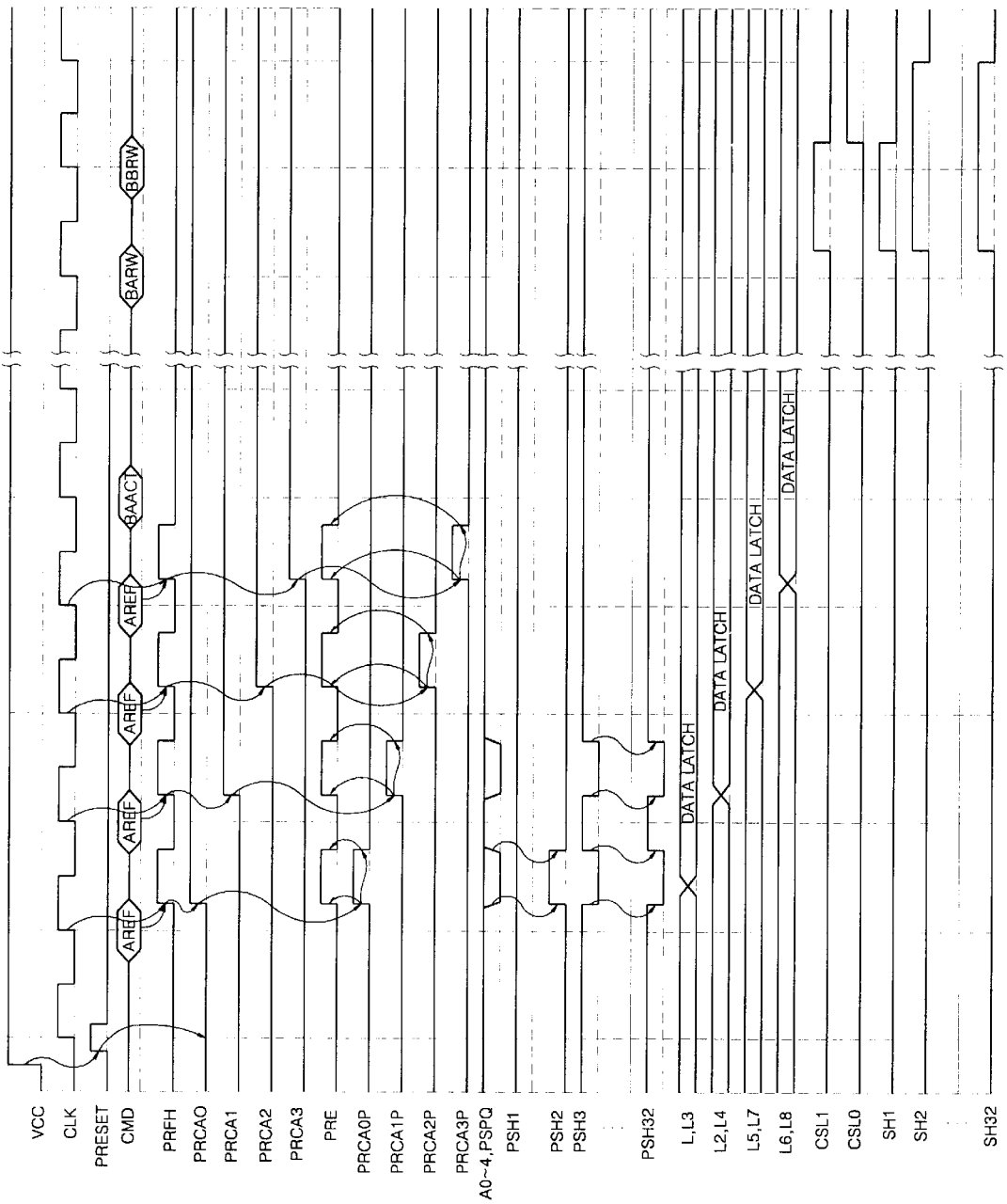
FIG. 12 is an operational timing diagram to illustrate the operation of the block diagram shown in FIG. 8.

FIG. 12 is an operational timing diagram for illustrating the operation of the circuit of FIG. 8. A dummy automatic refresh command AREF is applied for four cycles after a power source voltage VCC is applied. FIG. 12 illustrates the example where there is a defect in a memory cell associated with a column select signal CSL0 line of a partial block BLA1 of a memory cell array block BABLA of a memory cell array bank BA and in a memory cell associated with a column select signal CSL1 line of a partial block BLB2 of a memory cell array block BLB of a memory cell array bank BB.

When the column select signal CSL0 line is selected, data input/output line pairs (IO1, IO1B) to (IO32, IO32B) must be replaced with data input/output line pairs (IO2, IO2B) to (IO32, IO32B) and (RIO, RIOB), and when the column select signal CSL1 line is selected, data input/output line pairs (IO1, IO1B) to (IO32, IO322) must be replaced with other input/output line pairs (IO1, IO1B), (IO3, IO3B) to (IO32, IO32B), and (RIO, RIOB).

If the power voltage VCC is applied, a preset signal PRESET is generated, and if a refresh command AREF is applied, a dummy automatic refresh signal PRFH is generated in response to clock signal CLK and the refresh command AREF. A control signal generating circuit 36 is reset in response to the preset signal PRESET and generates "high" level signals PRCA0, PRCA1, PRCA2 and PRCA3 in response to the dummy automatic refresh signal PRFH and generates pulsed control signals PRCA0P, PRCA1P, PRCA2P and PRCA3P level in response to signals PRCA0, PRCA1, PRCA2 and PRCA3 transitioning to "high" level. These control signals PRCA0P, PRCA1P, PRCA2P and PRCA3P are asserted for one cycle.

Address setting circuit 38 generates a "high" level redundant control signal PSDQ and address "00000" in response to a "high" level control signal PRCA0P, and generates a "high" level redundant control signal PSDQ and address "00001" in response to a "high" level control signal PRCA1P.

Odd numbered decoder and shifting control circuits 34-1, 34-3, ... and 34-31, when the control signal PRCA0P is at "high" level, generate "high" level signals PSH2, PSH4, ... and PSH32 respectively by decoding the redundant control signal and the defective address output from address setting circuit 38. Even numbered decoder and shifting control circuits 34-2, 34-4, ... and 34-32, when the control signal PRCA0P is at a "high" level, decode the redundant control signal and the defective address output from address setting circuit 38 and generate "low" level signals PSH3 to PSH31, respectively.

Odd numbered decoder and shifting control circuits 34-1, 34-3, ... and 34-31, when the control signal PRCA1P is at "high" level, generate a "low" level signal PSH2 and "high" level signals PSH4, PSH6, ... and PSH32. Even numbered decoder and shifting control circuits 34-2, 34-4, ... and 34-32, when the control signal PRCA1P is at a "high" level, generate a "low" level decoding output signals PSH3, PSH5, ... and PSH31.

Each of odd numbered decoder and shifting control circuits 34-1, 34-3, ... and 34-31 latch and invert "low" level decoding output signals in response high-to-low transitions of control signals PRCA0P, PRCA1P, PRCA2P and PRCA3P. Each of even numbered decoder and shifting control circuits 34-2, 34-4, ... and 34-32 latches a "high" level decoding output signal of a decoder 50-1 of a decoder and shifting control circuit 34-1 and "low" level decoding output signals of decoders 50-1 and 50-2 of decoder and shifting control circuits 34-2 to 34-32 in response to high-to-low transitions of control signal PRCA1P. Each of even numbered decoder and shifting control circuits 34-2, 34-4, ... and 34-32 latches "low" level decoding output signals decoder and shifting control circuits in response to high-to-low transitions of control signals PRCA0P, PRCA2P, and PRCA3P.

In a row cycle, a bank active command BAACT is applied and bank signals BA and BB and block signals BABLA, BABLB, BABLC, BABLD, BBBLA, BBBLB, BBBLC and BBBLD are generated.

In a column cycle, if a bank read/write command BARW is applied and a column select signal CSL0 is generated, decoder and shifting control circuits 34-1 to 34-32 output "high" level data to shifting control signals SH1 to SH32 respectively in response to the column select signals CSL0. In a column cycle, if a bank read/write command BARW is applied and a column select signal CSL1 is generated, decoder and shifting control circuits 34-1 to 34-32 output "low" level data to a shifting control signal SH1 in response to the column select signal CSL1 and output "high" level data to shifting control signals SH2 to SH32.

Therefore, a semiconductor memory device and redundancy method thereof of the present invention can generate shifting control signals dynamically to column cycle by storing shifting control signals in latches before column cycle begins.

Also, a semiconductor memory device and redundancy method thereof of the present invention can construct a redundancy circuit using a small number of fuses in a multi bank structure.

While there have been illustrated and described what are considered to be preferred embodiments of the present invention, it will be understood by those skilled in the art that various changes and modifications may be made, and equivalents may be substituted for elements thereof without departing from the spirit and scope of the present invention.

What is claimed is:

1. A semiconductor memory device comprising:
   an address setting means for setting a redundant control signal and a defective address in response to a plurality of first control signals; and a plurality of decoder and shifting control circuits wherein each of said plurality of decoder and shifting control circuits includes:
- a decoder comprising an input coupled to receive said redundant control signal and said defective address, and an output coupled for providing a decoding output signal; and
- a plurality of latches for latching a latched signal coupled from said decoding output signal in response to each of a plurality of second control signals, wherein said plurality of latches provides a shifting control signal in response to each of a plurality of third control signals.

2. The semiconductor memory device as claimed in claim 1, wherein said address setting means comprises:
- a redundant control signal setting circuit for generating said redundant control signal; and
- a predetermined number of address setting circuits for setting predetermined bits of defective address in order to generate said redundant control signal.

3. The semiconductor memory device as claimed in claim 2, wherein said redundant control signal setting circuit comprises:
- a first precharge transistor for precharging a first node, said first precharge transistor connected between a power source voltage and said first node;
- a plurality of first pull down transistors responding to a corresponding one of a plurality of first fuses each one of said plurality of first pull down transistors and said corresponding plurality of first fuses connected serially between said first node and a ground voltage and said plurality of first fuses connected to a corresponding one of said plurality of first control signals;
- a first inverter coupled to said first node for inverting an output signal of said first node;
- a second precharge transistor for maintaining a precharged level of said first node in response to an output signal of said first inverter; and
- a second inverter for generating said redundant control signal by inverting said output signal of said first inverter.

4. The semiconductor memory device as claimed in claim 2, wherein each of said predetermined number of address setting circuits comprises:
- a third precharge transistor for precharging a second node, said third precharge transistor connected between a power source voltage and said second node;
- a plurality of second pull down transistors responding to a corresponding one of a plurality of second fuses each one of said plurality of second pull down transistors and said corresponding plurality of second fuses connected serially between said second node and a ground voltage and said plurality of second fuses connected to a corresponding one of said plurality of first control signals;
- a third inverter connected to said second node for inverting an output signal of said second node;
- a fourth precharge transistor for maintaining a precharged level of said second node in response to an output signal of said third inverter; and
- a fourth inverter for generating said defective address by inverting said output signal of said third inverter.

5. The semiconductor memory device as claimed in claim 1,
wherein each odd numbered circuit of said plurality of decoder and shifting control circuits generates an odd numbered shifting control signal for controlling shifting of odd numbered data input/output line pairs of a plurality of data input/output line pairs;
wherein each even numbered circuit of said plurality of decoder and shifting control circuits generates an even numbered shifting control signal for controlling shifting of even numbered data input/output line pairs of said plurality of data input/output line pairs; and
wherein in case that said shifting control signal of one of said plurality of decoder and shifting control circuits is at a "high" level, all shifting control signals of subsequent decoder and shifting control circuits after said one of said plurality of decoder and shifting control circuits go to said "high" level.

6. The semiconductor memory device as claimed in claim 5, wherein each of said odd numbered circuit of said plurality of decoder and shifting control circuits comprises:
- a first decoder for decoding said redundant control signal and a first set of predetermined bits of said defective address, and for generating an inverted first decoding output signal in response to an output signal of a second decoder from a previous even numbered circuit; and
- a plurality of first transmission and latch circuits for inverting and latching said decoding output signal in response to each of said plurality of second control signals, and for generating said latched signal to said odd numbered shifting control signal in response to each of said plurality of third control signals.

7. The semiconductor memory device as claimed in claim 6, wherein said first decoder comprises:
- a first NAND gate having inputs coupled to said redundant control signal and to said defective address;
- a second NAND gate for generating said inverted first decoding output signal having inputs coupled to an output signal of said first NAND gate and to a second decoding output signal from said previous even numbered circuit of said plurality of decoder and shifting control circuits; and
- a fifth inverter for generating said first decoding output signal by inverting an output signal of said second NAND gate.

8. The semiconductor memory device as claimed in claim 6, wherein each of said plurality of first transmission and latch circuits comprises:
- a first CMOS transmission gate for transmitting said decoding output signal in response to a corresponding one of said plurality of second control signal;
- a first latch for inverting and latching an output signal of said first CMOS transmission gate; and
- a second CMOS transmission gate for outputting an output signal of said first latch to said odd numbered shifting control signal in response to a corresponding one of said plurality of third control signal.

9. The semiconductor memory device as claimed in claim 5, wherein each of said even numbered circuit of said plurality of decoder and shifting control circuits comprises:
- a second decoder for decoding said redundant control signal and a second set of predetermined bits of said defective address and for generating a second decoding output signal in response to an output signal of a first decoder from a previous odd numbered circuit; and
- a plurality of second transmission and latch circuits for inverting and latching said second decoding output signal in response to each of said plurality of second control signals, and for generating said latched signals to said even numbered shifting control signal in response to each of said plurality of third control signals.

10. The semiconductor memory device as claimed in claim 9, wherein said second decoder comprises:
   a first AND gate for generating an output signal by AND operation of said redundant control signal and a second set of predetermined bits of defective address; and
   a first NOR gate for generating said second decoding output signal by NOR operation of an inverted first decoding output signal from a previous odd numbered circuit and said output signal of said first AND gate.

11. The semiconductor memory device as claimed in claim 9, wherein each of said plurality of second transmission and latch circuits comprises:
   a third CMOS transmission gate for transmitting said second decoding output signal in response to a corresponding one of said plurality of second control signals;
   a second latch for inverting and latching an output signal of said third CMOS transmission gate; and
   a fourth CMOS transmission gate for outputting an output signal of said second latch to said even numbered shifting control signal in response to a corresponding one of said plurality of third control signal.

12. A semiconductor memory device, comprising:
   a plurality of memory cell array banks;
   a plurality of memory cell array blocks of each of said plurality of memory cell array banks;
   a plurality of partial blocks of each of said plurality of memory cell array blocks connected to each of a plurality of data input/output line pairs and a predetermined number of redundant partial blocks of each of said plurality of memory cell array blocks connected to each of a predetermined number of redundant data input/output line pairs;
   an address setting means for setting a redundant control signal and each defective address of said plurality of memory cell array blocks;
   a plurality of decoder and shifting control signal generation means for generating a plurality of shifting control signals for controlling shifting of said plurality of data input/output line pairs and said predetermined number of redundant data input/output line pairs by decoding said redundant control signal and defective address; and
   a plurality of switching means
      for switching output data from one of said plurality of data input/output line pairs to an adjacent one of said plurality of data input/output line pairs in response to each of said plurality of shifting control signals, and
      for switching input data from one of said plurality of data input/output line pairs to an adjacent one of said plurality of data input/output line pairs.

13. The semiconductor memory device as claimed in claim 12, wherein said address setting means comprises:
   a redundant control signal setting circuit for generating said redundant control signal; and
   a predetermined number of address setting circuits for setting a predetermined set of bits of said defective address in order to select said plurality of data input/output line pairs.

14. The semiconductor memory device as claimed in claim 13, wherein said redundant control signal setting circuit comprises:

a first precharge transistor for precharging a first node, coupled between a power source voltage and the first node;
a plurality of first pull down transistors responding to a corresponding one of a plurality of first fuses each one of said plurality of first pull down transistors and said corresponding plurality of first fuses coupled serially between said first node and a ground voltage and coupled to a corresponding one of a plurality of select signals;
a first inverter coupled to said first node for inverting an output signal of said first node;
a second precharge transistor for maintaining a precharged level of said first node in response to said output signal of said first inverter; and
a second inverter for generating said redundant control signal by inverting the output signal of said first inverter; and
wherein redundancy operation is enabled by cutting one of said plurality of first fuses where select signals corresponding to defective memory cell array blocks of said plurality of memory cell array blocks are applied.

15. The semiconductor memory device as claimed in claim 13, wherein each of said predetermined number of address setting circuits comprises:
   a third precharge transistor for precharging a second node, coupled between a power source voltage and the second node;
   a plurality of second pull down transistors responding to a corresponding one of a plurality of second fuses each one of said plurality of second pull down transistors and said corresponding plurality of second fuses coupled serially between said second node and a ground voltage and coupled to a corresponding one of said plurality of select signals;
   a third inverter coupled to said second node for inverting an output signal of said second node;
   a fourth precharge transistor for maintaining a precharged level of said second node in response to the output signal of said third inverter; and
   a fourth inverter for generating said defective address by inverting the output signal of said third inverter; and
   wherein a "high" level address is generated by cutting said second fuses where said select signals of defective memory cell array blocks of said plurality of memory cell array blocks are applied and a "low" level address is generated by not cutting.

16. The semiconductor memory device as claimed in claim 12, wherein each of said plurality of decoder and shifting control circuits comprises:
   odd numbered decoder and shifting control circuits for generating an odd numbered shifting control signal for controlling shifting of odd numbered data input/output line pairs of said plurality of data input/output line pairs by decoding said defective address; and
   even numbered decoder and shifting control circuits for generating an even numbered shifting control signal for controlling shifting of even numbered data input/output line pairs of said plurality of data input/output line pairs by decoding said defective address, and
   wherein in case that said shifting control signal of one of said plurality of decoder and shifting control circuits is at a "high" level, all shifting control signals of subsequent decoder and shifting control circuits after said one of said plurality of decoder and shifting control circuits go to said "high" level.

17. The semiconductor memory device as claimed in claim 16, wherein each of said odd numbered circuit of said plurality of decoder and shifting control circuits comprises:
- a first decoder for decoding said redundant control signal and a first set of predetermined bits of said defective address, and for generating an inverted first decoding output signal in response to an output signal of a second decoder from a previous even numbered circuit; and
- a plurality of first transmission and latch circuits for inverting and latching said decoding output signal in response to each of a plurality of bank signals, and for generating a latched signal to said odd numbered shifting control signal in response to each of a plurality of bank read/write signals.

18. The semiconductor memory device as claimed in claim 16, wherein said first decoder comprises:
- a first NAND gate having inputs coupled to said redundant control signal and to said defective address;
- a second NAND gate for generating said inverted first decoding output signal having inputs coupled to an output signal of said first NAND gate and to a second decoding output signal from said previous even numbered circuit of said plurality of decoder and shifting control circuits; and
- a fifth inverter for generating said first decoding output signal by inverting an output signal of said second NAND gate.

19. The semiconductor memory device as claimed in claim 17, wherein each of said plurality of first transmission and latch circuits comprises:
- a first CMOS transmission gate for transmitting said decoding output signal in response to a corresponding bank signal;
- a first latch for inverting and latching an output signal of said first CMOS transmission gate; and
- a second CMOS transmission gate for outputting an output signal of said first latch to said odd numbered shifting control signal in response to a corresponding bank read/write signal.

20. The semiconductor memory device as claimed in claim 16, wherein each of said even numbered circuit of said plurality of decoder and shifting control circuits comprises:
- a second decoder for decoding said redundant control signal and a second set of predetermined bits of said defective address, and for generating a second decoding output signal in response to an output signal of a first decoder from a previous odd numbered circuit; and
- a plurality of second transmission and latch circuits for inverting and latching said second decoding output signal in response to each of a plurality of bank signals, and for generating said latched signals to said even numbered shifting control signal in response to each of a plurality of bank read/write signals.

21. The semiconductor memory device as claimed in claim 20, wherein said second decoder comprises:
- a first AND gate for generating an output signal by AND operation of said redundant control signal and a second set of predetermined bits of defective address; and
- a first NOR gate for generating said second decoding output signal by NOR operation of an inverted first decoding output signal from a previous odd numbered circuit and said output signal of said first AND gate.

22. The semiconductor memory device as claimed in claim 20, wherein each of said plurality of second transmission and latch circuits comprises:
- a third CMOS transmission gate for transmitting said inverted second decoding output signal in response to said corresponding bank signal;
- a second latch for inverting and latching an output signal of said third CMOS transmission gate; and
- a fourth CMOS transmission gate for outputting an output signal of said second latch to said even numbered shifting control signal in response to a corresponding bank read/write signal.

23. The semiconductor memory device as claimed in claim 12, wherein each of said plurality of switching means comprises:
- a first switching circuit for switching output data from one of said plurality of data input/output line pairs to an adjacent one of said plurality of data input/output line pairs in response to a corresponding one of said plurality of shifting control signals; and
- a second switching circuit for switching input data from one of said plurality of data input/output line pairs to an adjacent one of said plurality of data input/output line pairs in response to said corresponding one of said plurality of shifting control signals.

24. The semiconductor memory device as claimed in claim 23, wherein said first switching circuit comprises:
- a fifth CMOS transmission gate for outputting data output from said one of said plurality of data input/output line pairs in response to said corresponding one of said plurality of shifting control signals; and
- a sixth CMOS transmission gate for outputting data output from said adjacent one of said plurality of data input/output line pairs in response to an inverted corresponding one of said plurality of shifting control signals.

25. The semiconductor memory device as claimed in claim 23, wherein said second switching circuit comprises:
- a seventh CMOS transmission gate for inputting said input data to said one of said plurality of data input/output line pairs in response to said corresponding one of said plurality of shifting control signals; and
- an eighth CMOS transmission gate for inputting to said adjacent one of said plurality of data input/output line pairs in response to an inverted corresponding one of said plurality of shifting control signals.

26. A semiconductor memory device, comprising:
- a plurality of memory cell array banks;
- a plurality of memory cell array blocks of each of said plurality of memory cell array banks;
- a plurality of partial blocks of each of said plurality of memory cell array blocks connected to each of a plurality of data input/output line pairs and a predetermined number of redundant partial blocks of each of said plurality of memory cell array blocks connected to each of a predetermined number of redundant data input/output line pairs;
- a plurality of partial blocks according to a column address group of each of said plurality of partial blocks and said predetermined number of redundant partial blocks according to a column address group of each of said predetermined number of redundant partial blocks;
- a control signal generation means for generating selection control signals by said column address group for selecting a plurality of partial blocks according to said column address group in response to a refresh command;
- an address setting means for setting a redundant control signal by said column address group and a defective address in response to said selection control signals by said column address group;

a plurality of decoder and shifting control signal generation means for generating a plurality of shifting control signals for controlling shifting of said plurality of data input/output line pairs and said predetermined number of redundant data input/output line pairs by decoding said redundant control signal and said defective address; and a plurality of switching means for outputting data output from an adjacent data input/output line pair adjacent to a corresponding data input/output line pair in response to said plurality of shifting control signals, and for inputting input data to said adjacent data input/output line pair adjacent to said corresponding data input/output line pair.

27. The semiconductor memory device as claimed in claim 26, wherein said control signal generation means comprises:

a plurality of serially connected flip flops each comprising a reset terminal where a preset signal is applied and a clock signal terminal where said refresh command is applied and a data input terminal where an output signal in a former stage is applied; and a plurality of pulse width generating circuits for generating said selection control signals by said column address group having a predetermined pulse width by inputting signals output from each of said plurality of serially connected flip flops.

28. The semiconductor memory device as claimed in claim 26, wherein said address setting means comprises:

a redundant control signal setting circuit for generating said redundant control signal; and a predetermined number of address setting circuits for setting predetermined bits of said defective address in order to select said plurality of data input/output line pairs.

29. The semiconductor memory device as claimed in claim 28, wherein said redundant control signal setting circuit comprises:

a first precharge transistor for precharging a first node, said first precharge transistor connected to a power source voltage and said first node;

a plurality of first pull down transistors responding to a corresponding one of a plurality of first fuses each one of said plurality of first pull down transistors and said corresponding plurality of first fuses connected serially between said first node and a ground voltage and connected to a corresponding one of said selection control signals;

a first inverter coupled to said first node for inverting an output signal of said first node;

a second precharge transistor for maintaining a precharged level of said first node in response to an output signal of said first inverter; and a second inverter for generating said redundant control signal by inverting said output signal of said first inverter, and wherein redundancy operation is enabled by cutting one or more of said plurality of first fuses.

30. The semiconductor memory device as claimed in claim 28, where each of said predetermined number of address setting circuits comprises:

a third precharge transistor for precharging a second node, said third precharge transistor connected between a power source and said second node;

a plurality of second pull down transistors responding to a corresponding one of a plurality of second fuses each one of said plurality of second pull down transistors and said corresponding plurality of second fuses connected serially between said second node and a ground voltage and said plurality of second fuses connected to a corresponding one of said of said selection control signals;

a third inverter connected to said second node for inverting an output signal of said second node;

a fourth precharge transistor for maintaining a precharged level of said second node in response to an output signal of said third inverter; and a fourth inverter for generating said defective address by inverting said output signal of said third inverter, and wherein a "high" level address is generated by cutting a corresponding one of said plurality of second fuses and a "low" level address is generated by not cutting said corresponding one of said plurality of second fuses.

31. The semiconductor memory device as claimed in claim 26, wherein said plurality of decoder and shifting control generation means comprises a plurality of decoder and shifting control circuits:

wherein each odd numbered circuit of said plurality of decoder and shifting control circuits generates an odd numbered shifting control signal for controlling shifting of odd numbered data input/output line pairs of a plurality of data input/output line pairs;

wherein each even numbered circuit of said plurality of decoder and shifting control circuits generates an even numbered shifting control signal for controlling shifting of even numbered data input/output line pairs of said plurality of data input/output line pairs; and wherein in case that said shifting control signal of one of said plurality of decoder and shifting control circuits is at a "high" level, all shifting control signals of subsequent decoder and shifting control circuits after said one of said pluraity of decoder and shifting control circuits go to said "high" level.

32. The semiconductor memory device as claimed in claim 31, wherein each of said odd numbered circuit of said plurality of decoder and shifting control circuits comprises:

a first decoder decoding said redundant control signal and a first set of predetermined bits of said defective address, and for generating an inverted first decoding output signal in response to an output signal of a second decoder from a previous even numbered circuit; and a plurality of first transmission and latch circuits for inverting and latching said decoding output signal in response to each of a plurality of control signals, and for generating said latched signals to said odd numbered shifting control signal in response to each of a plurality of select signals by column address group.

33. The semiconductor memory device as claimed in claim 32, wherein said first decoder comprises:

a first NAND gate having inputs coupled to said redundant control signal and to said defective address;

a second NAND gate for generating said inverted first decoding output signal having inputs coupled to an output signal of said first NAND gate and to a second decoding output signal from said previous even numbered circuit of said plurality of decoder and shifting control circuits; and a fifth inverter for generating said first decoding output signal by inverting an output signal of said second NAND gate.

34. The semiconductor memory device as claimed in claim 32, wherein each of said plurality of first transmission and latch circuits comprises:
- a first CMOS transmission gate for transmitting said decoding output signal in response to a corresponding one of said plurality of control signals;
- a first latch for inverting and latching an output signal of said first CMOS transmission gate; and
- a second CMOS transmission gate for outputting an output signal of said first latch to said odd numbered shifting control signal in response to each of said plurality of select signals by column address group.

35. The semiconductor memory device as claimed in claim 31, wherein each of said even numbered circuit of said plurality of decoder and shifting control circuits comprises:
- a second decoder decoding said redundant control signal an a second set of predetermined bits of said defective address, and for generating a second decoding output signal in response to an output signal of a first decoder from a previous odd numbered circuit; and
- a plurality of second transmission and latch circuits for inverting and latching said second decoding output signal in response to each of said plurality of control signals, and for generating said latched signals to said even numbered shifting control signal in response to each of said plurality of select signals by column address group.

36. The semiconductor memory device as claimed in claim 35, wherein said second decoder comprises:
- a first AND gate for generating an output signal by AND operation of said redundant control signal and a second set of predetermined bits of defective address; and
- a first NOR gate for generating said second decoding output signal by NOR operation of an inverted first decoding output signal from a previous odd numbered circuit and said output signal of said first AND gate.

37. The semiconductor memory device as claimed in claim 35, wherein each of said plurality of second transmission and latch circuits comprises:
- a third CMOS transmission gate for transmitting said second decoding output signal in response to a corresponding one of said plurality of control signals;
- a second latch for inverting and latching an output signal of said third CMOS transmission gate; and
- a fourth CMOS transmission gate for outputting an output signal of said second latch to said even numbered shifting control signal in response to a corresponding one of said plurality of select signals by column address group.

38. The semiconductor memory device as claimed in claim 26, wherein each of said plurality of switching means comprises:
- a first switching circuit for switching output data from one of said plurality of data input/output line pairs to an adjacent one of said plurality of data input/output line pairs in response to a corresponding one of said plurality of shifting control signals; and
- a second switching circuit for switching input data from one of said plurality of data input/output line pairs to an adjacent one of said plurality of data input/output line pairs in response to said corresponding one of said plurality of shifting control signals.

39. The semiconductor memory device as claimed in claim 38, wherein said first switching circuit comprises:
- a fifth CMOS transmission gate for outputting data output from said one of said plurality of data input/output line pairs in response to said corresponding one of said plurality of shifting control signals; and
- a sixth CMOS transmission gate for outputting data output from said adjacent one of said plurality of data input/output line pairs in response to an inverted corresponding one of said plurality of shifting control signals.

40. The semiconductor memory device as claimed in claim 38, wherein said second switching circuit comprises:
- a seventh CMOS transmission gate for inputting said input data to said one of said plurality of data input/output line pairs in response to said corresponding one of said plurality of shifting control signals; and
- an eighth CMOS transmission gate for inputting to said adjacent one of said plurality of data input/output line pairs in response to an inverted corresponding one of said plurality of shifting control signals.

41. A redundancy method for a semiconductor memory device comprising:
- setting a redundant control signal and a defective address of each of a plurality of memory cell array blocks;
- generating a plurality of shifting control signals for controlling shifting of a plurality of data input/output line pairs and a predetermined number of redundant data input/output line pairs by decoding said defective address; and
- outputting data output from an adjacent data input/output line pair adjacent to a corresponding data input/output line pair in response to each of said plurality of shifting control signals, and of inputting input data to said adjacent data input/output line pair adjacent to said corresponding data input/output line pair.

42. A redundancy method of a semiconductor memory device comprising:
- generating selection control signals by column address group for selecting a plurality of partial blocks according to a column address group in response to an automatic refresh command;
- setting a redundant control signal by column address group and a defective address in response to said selection control signals by column address group;
- generating a plurality of shifting control signals for controlling shifting of a plurality of data input/output line pairs and a predetermined number of redundant data input/output line pairs by decoding said redundant control signal and said defective address; and
- outputting data output from an adjacent data input/output line pair adjacent to a corresponding data input/output line pair in response to each of said plurality of shifting control signals, and inputting input data to said adjacent data input/output line pair adjacent to said corresponding data input/output line pair.

* * * * *